(12) United States Patent
Okamura

(10) Patent No.: US 6,175,136 B1
(45) Date of Patent: Jan. 16, 2001

(54) METHOD OF FORMING CMOS DEVICE WITH IMPROVED LIGHTLY DOPED DRAIN STRUCTURE

(75) Inventor: Ryuichi Okamura, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/039,487

(22) Filed: Mar. 16, 1998

(30) Foreign Application Priority Data

Mar. 14, 1997 (JP) .................................... 9-082065

(51) Int. Cl.⁷ .............................................. H01L 21/8238
(52) U.S. Cl. ............................................ 257/369; 257/408
(58) Field of Search ........................... 257/408; 438/305, 438/306, FOR 188

(56) References Cited

U.S. PATENT DOCUMENTS

| | | | |
|---|---|---|---|
| 5,021,353 | * | 6/1991 | Lowrey et al. . |
| 5,254,866 | * | 10/1993 | Ogoh . |
| 5,278,441 | * | 1/1994 | Kang et al. . |
| 5,291,052 | * | 3/1994 | Kim et al. . |
| 5,851,866 | * | 12/1998 | Son . |
| 5,904,528 | * | 5/1999 | Lin et al. . |
| 5,908,315 | * | 6/1999 | Gardner et al. . |
| 5,926,714 | * | 7/1999 | Gardner et al. . |

FOREIGN PATENT DOCUMENTS

| | | |
|---|---|---|
| 60-245269 | 12/1985 | (JP) . |
| 64-44059 | 2/1989 | (JP) . |
| 5-3297 | 1/1993 | (JP) . |
| 7-183390 | 7/1995 | (JP) . |
| 7-202010 | 8/1995 | (JP) . |
| 8-37239 | 2/1996 | (JP) . |
| 8-46057 | 2/1996 | (JP) . |
| 8-88362 | 4/1996 | (JP) . |
| 8-321557 | 12/1996 | (JP) . |
| 8-330438 | 12/1996 | (JP) . |

* cited by examiner

Primary Examiner—George Fourson
(74) Attorney, Agent, or Firm—Young & Thompson

(57) ABSTRACT

A semiconductor device has at least a p-channel MOS field effect transistor and at least an n-channel MOS field effect transistor, both of which are integrated on a single semiconductor substrate. The p-channel MOS field effect transistor has at least a first p-type lightly doped diffusion region adjacent to a p-type drain diffusion region. The n-channel MOS field effect transistor has at least a first n-type lightly doped diffusion region adjacent to an n-type drain diffusion region. The first p-type lightly doped diffusion region of the p-channel MOS field effect transistor is shorter in a direction parallel to a channel length direction than a first n-type lightly doped diffusion region of the n-channel MOS field effect transistor.

21 Claims, 19 Drawing Sheets

METHOD OF FORMING CMOS DEVICE WITH IMPROVED LIGHTLY DOPED DRAIN STRUCTURE

BACKGROUND OF THE INVENTION

The present invention relates to a semiconductor device, and more particularly to a CMOS device with an improved lightly doped drain structure suppressing hot carriers, which allows the CMOS device to exhibit high performance and to be scaled down, as well as a method of forming the same.

As the MOS field effect transistor has been scaled down, serious problems are raised with deterioration of performance of the MOS field effect transistor due to hot carrier injection and also with leakage of current between a source and a drain of the MOS field effect transistor due to short channel effects.

In order to avoid the deterioration of the performance due to the hot carrier injections, it is effective to relax the electric field in the vicinity of the drain of the MOS field effect transistor. In order to relax the electric field, it is effective to form a lightly doped drain structure of the MOS field effect transistor.

On the other hand, the leakage of current between the source and drain of the MOS field effect transistor is caused by punch through phenomenons. The punch through phenomenons are caused by the fact that the space charge regions of the source and drain regions are made adjacent to each other.

The MOS field effect transistors usually have a double-layered structure like a gate electrode that comprises an n-type polysilicon layer or a double layered structure of an n-type polysilicon layer and a metal suicide layer. In this case, an n-channel MOS field effect transistor is a surface channel MOS field effect transistor, whilst a p-channel MOS field effect transistor is a buried channel MOS field effect transistor. A remarkable leakage of current between source and drain regions due to the punch through phenomenon may appear in the buried p-channel MOS field effect transistor. However, the buried p-channel MOS field effect transistor has a sufficient distance between a channel region and a gate oxide film for preventing hot carriers from being injected into the gate oxide film, for which reason the buried p-channel MOS field effect transistor reduces the deterioration of the performance due to the hot carrier injection into the oxide film.

In order to settle the above problem with the source-drain current leakage due to the punch through phenomenon, it is effective to form punch through stopper regions under the lightly doped drain p-type diffusion layers of the p-channel MOS field effect transistor. The following descriptions will focus on the p-channel MOS field effect transistor with the punch through stopper regions under the lightly doped drain p-type diffusion layers. FIG. 1 is a fragmentary cross sectional elevation view illustrative of a conventional CMOS device including a p-channel MOS field effect transistor with punch through stopper regions. The CMOS device is formed on a p-channel semiconductor substrate 10. Field oxide films 20 having a thickness of about 300–500 nanometers are selectively formed over a surface of the p-channel semiconductor substrate 10 to define active regions of the p-channel semiconductor substrate 10. Further, a p-type impurity such as boron is selectively ion-implanted into regions under the field oxide films 20 thereby forming p-type channel stoppers 21. A p-well region 11 and an n-well region 12 are formed in an upper region of the p-channel semiconductor substrate 10. The p-well region 11 is selectively formed by a selective ion-implantation of a p-type impurity such as boron into the p-channel semiconductor substrate 10 and a subsequent heat treatment at a temperature of 1000–1200° C. in a nitrogen atmosphere for 30–60 minutes. On the other hand, the n-well region 12 is selectively formed by a selective ion-implantation of an n-type impurity such as phosphorus or arsenic into the p-channel semiconductor substrate 10 and the above subsequent heat treatment.

A gate oxide film 30 having a thickness of about 6–10 nanometers is formed which extends over the p-well region 11 and the n-well region 12 as well as over the field oxide films 20. A heavily doped n+-type polysilicon layer 32 is entirely formed which extends over the gate oxide film 30. Further, a metal silicide layer 33 such as a tungsten silicide layer is formed which extends over the heavily doped n+-type polysilicon layer 32. The laminations of the heavily doped n+-type polysilicon layer 32 and the metal silicide layer 33 are patterned by a photo-lithography technique to thereby form gate electrodes 31 which comprise the laminations of the heavily doped n+-type polysilicon layer 32 and the metal silicide layer 33. An n-type impurity such as phosphorus or arsenic is selectively ion-implanted into the p-well region 11 by use of the gate electrode 31 and the field oxide films 20 as masks whereby lightly doped drain n--type diffusion layers 41 are formed in the p-well region 11. A p-type impurity such as boron or boron fluoride is also selectively ion-implanted into the n-well region 12 by use of the gate electrode 31 and the field oxide films 20 as masks whereby lightly doped drain p--type diffusion layers 42 are formed in the n-well region 12. Further, an n-type impurity such as phosphorus or arsenic is selectively ion-implanted into the n-well region 12 and under the lightly doped drain p--type diffusion layers 42 but only in the vicinity of a channel region defined between the lightly doped drain p--type diffusion layers 42 whereby punch through stopper regions 43 are selectively formed in the n-well region 12 and under the lightly doped drain p--type diffusion layers 42 but only in the vicinity of a channel region defined between the lightly doped drain p--type diffusion layers 42.

A silicon oxide film is entirely formed which extends over the gate electrodes 31, the lightly doped drain n--type diffusion layers 41, and the lightly doped drain p--type diffusion layers 42 as well as the field oxide films 20. The silicon oxide film is then subjected to an etch back to selectively form side wall oxide films 50 on side walls of the gate electrodes 31.

An n-type impurity such as phosphorus and arsenic is selectively ion-implanted into the p-well region 11 by use of the field oxide films 20, the gate electrode 31 and the side wall oxide films 50 as masks to selectively form source/drain n+-type diffusion layers 61 in the p-well region 11. A p-type impurity such as boron is selectively ion-implanted into the n-well region 12 by use of the field oxide films 20, the gate electrode 31 and the side wall oxide films 50 as masks to selectively form source/drain p+-type diffusion layers 62 in the p-well region 12. As a result, an n-channel MOS field effect transistor is formed in the p-well region 11, whilst a p-channel MOS field effect transistor is formed in the n-well region 12.

As described above, the conventional CMOS device has the punch through stoppers 43 in the n-well region 12 and under the side wall oxide films 50 in order to prevent the punch through of the p-channel MOS field effect transistor or prevent leakage of current between the source and drain regions of the p-channel MOS field effect transistor.

Since, however, boron as the p-type impurity has a large diffusion constant in silicon, the p-type diffusion layers such as the lightly doped drain layers 42 and the source and drain diffusion layers 62 show large diffusion in a lateral direction. For this reason, it is required to provide a large width of the side walls so as to prevent the n-type diffusion layers that serve as the punch through stoppers from being captured by or overlapped by the p-type diffusion layers whereby the punch through stoppers can no longer exhibit those function for preventing the punch through between the source and drain.

The side walls of the n-channel and p-channel MOS field effect transistors selectively formed in the p-well and n-well regions 11 and 12 are made from a single silicon oxide film through the etch back process, for which reason the side walls of the n-channel and p-channel MOS field effect transistors have the same width. In order to ensure the sufficiently large punch through stoppers, it is required to provide a large width of the side walls of the p-channel MOS field effect transistor in the n-well region 12. This means that the side walls of the n-channel MOS field effect transistor in the p-well region 11 also have the same large width as the side walls of the p-channel MOS field effect transistor in the n-well region 12. Further, a length of the lightly doped drain n--type diffusion layers 41 are substantially the same as the side walls of the n-channel MOS field effect transistor in the p-well region 11. This means that the lightly doped drain n--type diffusion layers also have a long length. The enlargement in length of the lightly doped drain n--type diffusion layers 41 of the n-channel MOS field effect transistor in the p-well region 11 causes an increase in parasitic capacitance of the n-channel MOS field effect transistor. The increase in parasitic capacitance of the n-channel MOS field effect transistor results in a reduction of driving power.

For the above conventional CMOS device, it is difficult to obtain both the p-channel MOS field effect transistor which is capable of preventing the punch through and the n-channel MOS field effect transistor which has a large driving power.

In order to settle the above problems, a second conventional CMOS device has been proposed which is disclosed in Japanese laid-open patent publication No. 7-183390. This second conventional CMOS device will be described with reference to FIG. 2. FIG. 2 is a fragmentary cross sectional elevation view illustrative of another conventional CMOS device including a p-channel MOS field effect transistor with punch through stopper regions. The CMOS device is formed on a p-channel semiconductor substrate 10. Field oxide films 20 having a thickness of about 300–500 nanometers are selectively formed over a surface of the p-channel semiconductor substrate 10 to define active regions of the p-channel semiconductor substrate 10. Further, a p-type impurity such as boron is selectively ion-implanted into regions under the field oxide films 20 thereby forming p-type channel stoppers 21. A p-well region 11 and an n-well region 12 are formed in an upper region of the p-channel semiconductor substrate 10. The p-well region 11 is selectively formed by a selective ion-implantation of a p-type impurity such as boron into the p-channel semiconductor substrate 10 and a subsequent heat treatment at a temperature of 1000–1200° C. in a nitrogen atmosphere for 30–60 minutes. On the other hand, the n-well region 12 is selectively formed by a selective ion-implantation of an n-type impurity such as phosphorus or arsenic into the p-channel semiconductor substrate 10 and the above subsequent heat treatment.

A gate oxide film 30 having a thickness of about 6–10 nanometers is formed which extends over the p-well region 11 and the n-well region 12 as well as over the field oxide films 20. A heavily doped n+-type polysilicon layer 32 is entirely formed which extends over the gate oxide film 30. Further, a metal suicide layer 33 such as a tungsten silicide layer is formed which extends over the heavily doped n+-type polysilicon layer 32. The laminations of the heavily doped n+-type polysilicon layer 32 and the metal silicide layer 33 are patterned by a photo-lithography technique to thereby form gate electrodes 31 which comprise the laminations of the heavily doped n+-type polysilicon layer 32 and the metal suicide layer 33. An n-type impurity such as phosphorus or arsenic is selectively ion-implanted into the p-well region 11 by use of the gate electrode 31 and the field oxide films 20 as masks whereby lightly doped drain n--type diffusion layers 41 are formed in the p-well region 11. A p-type impurity such as boron or boron fluoride is also selectively ion-implanted into the n-well region 12 by use of the gate electrode 31 and the field oxide films 20 as masks whereby lightly doped drain p--type diffusion layers 42 are formed in the n-well region 12. Further, an n-type impurity such as phosphorus or arsenic is selectively ion-implanted into the n-well region 12 and under the lightly doped drain p--type diffusion layers 42 but only in the vicinity of a channel region defined between the lightly doped drain p--type diffusion layers 42 whereby punch through stopper regions 43 are selectively formed in the n-well region 12 and under the lightly doped drain p--type diffusion layers 42 but only in the vicinity of a channel region defined between the lightly doped drain p--type diffusion layers 42.

A silicon oxide film is entirely formed which extends over the gate electrodes 31, the lightly doped drain n--type diffusion layers 41, and the lightly doped drain p--type diffusion layers 42 as well as the field oxide films 20. The silicon oxide film is then subjected to an etch back to selectively form first side wall oxide films 51 on side walls of the gate electrodes 31.

An n-type impurity such as phosphorus and arsenic is selectively ion-implanted into the p-well region 11 by use of the field oxide films 20, the gate electrode 31 and the first side wall oxide films 51 as masks to selectively form source/drain n+-type diffusion layers 61 in the p-well region 11.

A second oxide film is entirely formed which extends over the first side wall oxide films 51, the gate electrodes 31, the lightly doped drain n--type diffusion layers 41, and the lightly doped drain p--type diffusion layers 42 as well as the field oxide films 20. The second silicon oxide film is then subjected to an etch back to selectively form second side wall oxide films 52 on the first side wall oxide films 51 whereby gate side walls 50 are formed on the opposite side walls of the gate electrodes 31 which comprise the first and second side wall oxide films 51 and 52.

A p-type impurity such as boron or boron fluoride is selectively ion-implanted into the n-well region 12 by use of the field oxide films 20, the gate electrode 31 and the side wall oxide films 50 as masks to selectively form source/drain p+-type diffusion layers 62 in the p-well region 12. As a result, an n-channel MOS field effect transistor is formed in the p-well region 11, whilst a p-channel MOS field effect transistor is formed in the n-well region 12.

The side walls of the n-channel and p-channel MOS field effect transistors selectively formed in the p-well and n-well regions 11 and 12 comprise double layered silicon oxide films 51 and 52. Namely, a length of the lightly doped drain n--type diffusion layers 41 is substantially the same as the thickness of the first side wall oxide film 51 whilst the punch through stoppers 43 has substantially the same width as the total thickness of the first and second side wall oxide films 51 and 52. This means that the lightly doped drain n--type diffusion layers are allowed to be reduced in length, even the punch through stoppers 43 have a sufficiently large width for preventing the punch through. The reduction in length of the lightly doped drain n--type diffusion layers 41 of the n-channel MOS field effect transistor in the p-well region 11 causes a reduction in parasitic capacitance of the n-channel MOS field effect transistor. The reduction in parasitic capacitance of the n-channel MOS field effect transistor allows an increase of driving power.

Of the advanced MOS field effect transistors, the n-channel MOS field effect transistor has a gate which comprises a double layered structure of an n-doped polysilicon layer and a metal silicide layer. On the other hand, the p-channel MOS field effect transistor has a gate which comprises a double layered structure of a p-doped polysilicon layer and a metal silicide layer. For those reasons, both the n-channel and p-channel MOS field effect transistors are of the surface channel type.

The surface p-channel MOS field effect transistor may reduce the short channel effects remarkably as compared to the conventional buried p-channel MOS field effect transistor. In the buried p-channel MOS field effect transistor, the channel region is formed which is positioned just deeper than the interface between the gate oxide film and the silicon substrate, for which reason the p-type impurity such as boron is required to be ion-implanted deeply thereby resulting in an enlargement in lateral diffusion of the p-type impurity. This enlargement in lateral diffusion of the p-type impurity causes a remarkable short channel effect.

By contrast, in the surface channel type MOS field effect transistor, the channel region is formed in the vicinity of the interface between the gate oxide film and the silicon substrate, for which reason the lightly doped drain p--type diffusion layers and the source/drain p+-type diffusion layers are formed shallow in the vicinity of the surface of the semiconductor substrate, for which reason a lateral diffusion of boron is somewhat suppressed. As a result, the short channel effect is suppressed.

The shallow diffusion layers and the short-distance diffusion of the p-type impurity allows shortening the lightly doped drain regions because the punch through stopper regions are not overlapped or captured by the lightly doped drain layers and the source/drain diffusion layers.

Of the surface channel MOS field effect transistors, both the p-channel and n-channel MOS field effect transistors are more concerned with the problem in characteristic deterioration due to the hot carriers rather than the short channel effects. Such characteristic deterioration due to the hot carriers is remarkable as the field concentration of the transistor is increased by scaling down the transistor.

The carrier of the n-channel MOS field effect transistor is electron, whilst the carrier of the p-channel MOS field effect transistor is hole. Since electron is much smaller in mass than hole, electron injection is caused at a higher speed than hole injection under the same electric field. Namely, if the field relaxation at the lightly doped drain regions is almost the same between the n-channel and p-channel MOS field effect transistors, the probability of causing the hot carrier in the n-channel MOS field effect transistor is higher than that of the p-channel MOS field effect transistor. This means that in order to provide the n-channel and p-channel MOS field effect transistors with the same resistively to the hot carrier, it is required to largely relax the field concentration at the lightly doped drain region of the n-channel MOS field effect transistor as compared to the p-channel MOS field effect transistor.

The intensity of the field at the lightly doped drain region is defined by a gradient of the impurity concentration profile over the lightly doped drain region, for which reason it is required that the n-channel MOS field effect transistor has a larger gradient of the impurity concentration profile over the lightly doped drain region as compared to the p-channel MOS field effect transistor. It is therefore required to ensure a large length of the lightly doped drain layer.

Consequently, the first conventional CMOS device has the problem that since the side walls of the n-channel and p-channel MOS field effect transistors are the same, then it is difficult to obtain both the sufficiently wide punch through layers of the p-channel MOS field effect transistor for preventing the punch through and the shortened lightly doped drain layers of the n-channel MOS field effect transistors for reduction in parasitic capacitance to improve the driving ability.

The second conventional CMOS device has the problem that the p-channel MOS field effect transistor has the long size lightly doped drain layer whereby the driving power is deteriorated.

Accordingly, of the first and second conventional CMOS devices, it is difficult to obtain both the sufficiently wide punch through layers of the p-channel MOS field effect transistor for preventing the punch through and the shortened lightly doped drain layers of the n-channel MOS field effect transistors for reduction in parasitic capacitance to improve the driving ability.

In the above circumstances, it had been required to develop a novel CMOS device having sufficiently wide punch through layers of the p-channel MOS field effect transistor for preventing the punch through and sufficiently shortened lightly doped drain layers of the n-channel MOS field effect transistors for reduction in parasitic capacitance to improve the driving ability for high speed performance.

SUMMARY OF THE INVENTION

Accordingly, it is an object of the present invention to provide a novel CMOS device free from the above problems.

It is a further object of the present invention to provide a novel CMOS device having sufficiently wide punch through layers of the p-channel MOS field effect transistor for preventing the punch through and sufficiently shortened lightly doped drain layers of the n-channel MOS field effect transistors for reduction in parasitic capacitance to improve the driving ability for high speed performance.

It is a still further object of the present invention to provide a novel method of forming a CMOS device free from the above problems.

It is yet a further object of the present invention to provide a novel method of forming a CMOS device having sufficiently wide punch through layers of the p-channel MOS field effect transistor for preventing the punch through and sufficiently shortened lightly doped drain layers of the n-channel MOS field effect transistors for reduction in parasitic capacitance to improve the driving ability for high speed performance.

The above and other objects, features and advantages of the present invention will be apparent from the following descriptions.

The first present invention provides a semiconductor device having at least a p-channel MOS field effect transistor and at least an n-channel MOS field effect transistor, both of which are integrated on a single semiconductor substrate.

The p-channel MOS field effect transistor has at least a first p-type lightly doped diffusion region adjacent to a p-type drain diffusion region. The n-channel MOS field effect transistor has at least a first n-type lightly doped diffusion region adjacent to an n-type drain diffusion region. The first p-type lightly doped diffusion region of the p-channel MOS field effect transistor is shorter in a direction parallel to a channel length direction than a first n-type lightly doped diffusion region of the n-channel MOS field effect transistor.

The second present invention provides a CMOS device comprising a p-channel MOS field effect transistor and an n-channel MOS field effect transistor, both of which are integrated on a single semiconductor substrate. The p-channel MOS field effect transistor has a first aspect of the p-type lightly doped diffusion region adjacent to a p-type drain diffusion region. The n-channel MOS field effect transistor has a first n-type lightly doped diffusion region adjacent to an n-type drain diffusion region. The first p-type lightly doped diffusion region of the p-channel MOS field effect transistor is shorter in a direction parallel to a channel length direction than a first n-type lightly doped diffusion region of the n-channel MOS field effect transistor.

The third present invention provides a method of forming n-type and p-type lightly doped diffusion regions respectively adjacent to n-type and p-type source/drain regions of n-channel and p-channel MOS field effect transistors which are respectively formed in a p-well region and an n-well region on a single semiconductor substrate. The method comprises the following steps. n-type and p-type lightly doped diffusion regions are selectively formed in the p-well region and the n-well region by use of first and second gate electrodes respectively formed over the p-well and n-well regions as masks. First side wall oxide films are selectively formed on opposite side walls of each of the first and second gate electrodes. A first photo-resist film is selectively formed over the p-well region. p-type source and drain regions are selectively formed in the n-well region by use of the first photo-resist film and the second gate electrode as masks so that the p-type lightly doped diffusion regions remain only under the first side wall oxide films whereby a length of the p-type lightly doped diffusion regions is substantially defined by a thickness of the first side wall oxide film. The first photo-resist film is removed. Second side wall oxide films are selectively formed on the first side wall oxide films having been formed on the opposite side walls of each of the first and second gate electrodes. A second photo-resist film is selectively formed over the n-well region. n-type source and drain regions are selectively formed in the p-well region by use of the second photo-resist film and the first gate electrode as masks so that the n-type lightly doped diffusion regions remain only under laminations of the first and second side wall oxide films whereby a length of the n-type lightly doped diffusion regions is substantially defined by a total thickness of the first and second side wall oxide films, wherein the p-type lightly doped diffusion regions have a shorter length in a direction along a channel length direction than that of the n-type lightly doped diffusion regions.

The fourth present invention provides a method of forming n-type and p-type lightly doped diffusion regions respectively adjacent to n-type and p-type source/drain regions of n-channel and p-channel MOS field effect transistors which are respectively formed in a p-well region and an n-well region on a single semiconductor substrate. The method comprises the following steps. A first photo-resist film is selectively formed over the n-well region. n-type lightly doped diffusion region is selectively formed in the p-well region by use of a first gate electrode formed over the p-well region and the first photo-resist film as masks. The first photo-resist film is removed. A second photo-resist film is formed except over a source formation region in the p-well region. An n-type source region is selectively formed in the p-well region by use of the second photo-resist film and the first gate electrode as masks whereby the n-type lightly doped diffusion region on the source formation region is made into the n-type source region. The second photo-resist film is remove. A third photo-resist film is selectively formed over the p-well region. p-type lightly doped diffusion regions are selectively formed in the n-well region by use of a second gate electrode formed over the n-well region and the third photo-resist film as masks. The third photo-resist film is removed. A fourth photo-resist film is formed except over a source formation region in the n-well region. A p-type source region is selectively formed in the n-well region by use of the fourth photo-resist film and the second gate electrode as masks whereby the p-type lightly doped diffusion region on the source formation region is made into the p-type source region. The fourth photo-resist film is removed. First side wall oxide films are formed on opposite side walls of each of the first and second gate electrodes. A fifth photo-resist film is selectively formed over the p-well region. A p-type drain region is selectively formed in the n-well region by use of the fifth photo-resist film and the second gate electrode as masks so that the p-type lightly doped diffusion region remains only under the first side wall oxide film in the vicinity of the p-type drain region whereby a length of the p-type lightly doped diffusion region is substantially defined by a thickness of the first side wall oxide film. The fifth photo-resist film is removed. Second side wall oxide films are selectively formed on the first side wall oxide films having been formed on the opposite side walls of each of the first and second gate electrodes. A sixth photo-resist film is selectively formed over the n-well region. An n-type drain region is selectively formed in the p-well region by use of the sixth photo-resist film and the first gate electrode as masks so that the n-type lightly doped diffusion region remains only under laminations of the first and second side wall oxide films in the vicinity of the n-type drain region whereby a length of the n-type lightly doped diffusion region is substantially defined by a total thickness of the first and second side wall oxide films, wherein the p-type lightly doped diffusion region has a shorter length in a direction along a channel length direction than that of the n-type lightly doped diffusion region.

BRIEF DESCRIPTION OF THE DRAWINGS

Preferred embodiments according to the present invention will be described in detail with reference to the accompanying drawings.

DISCLOSURE OF THE INVENTION

Figure 1:
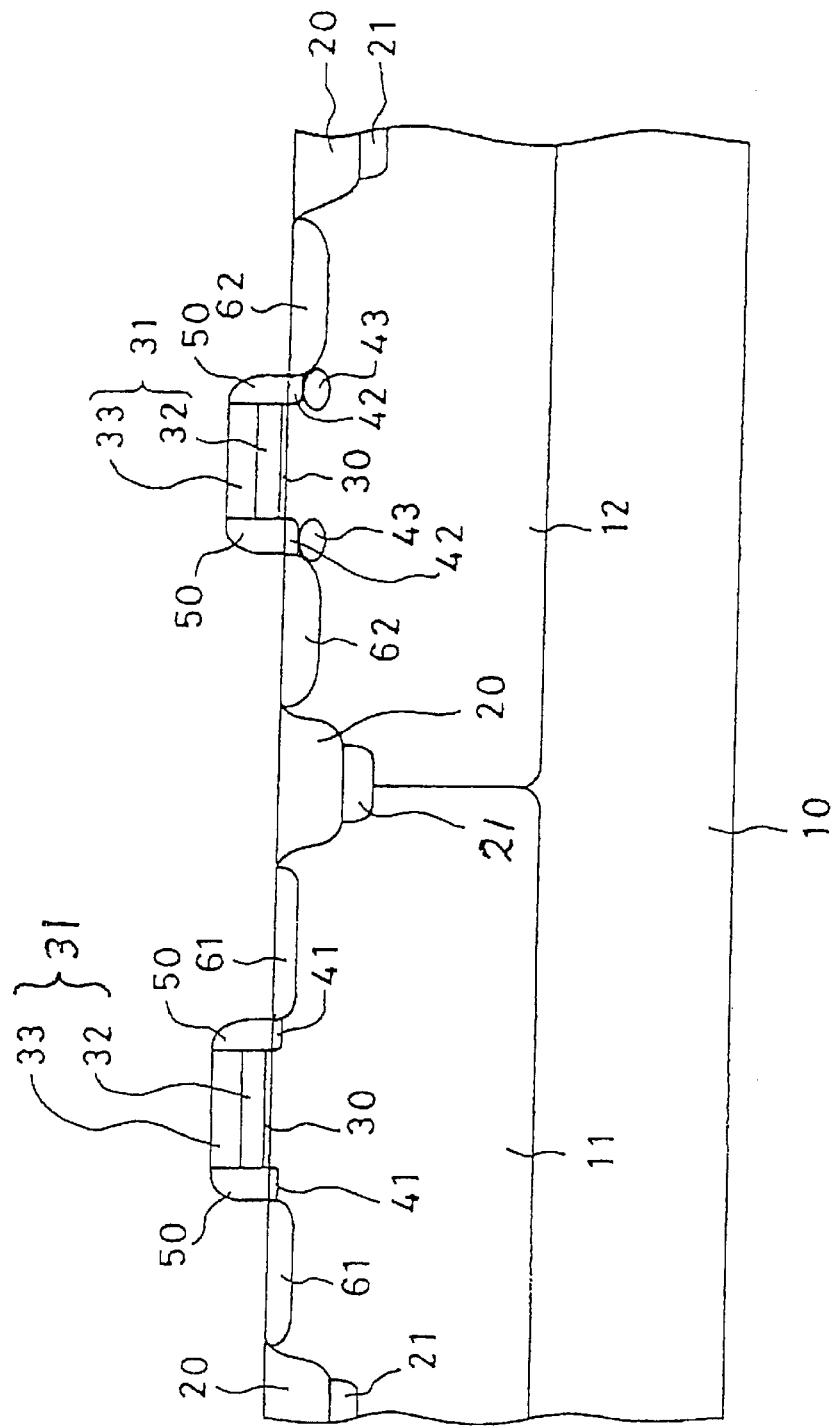
FIG. 1 is a fragmentary cross sectional elevation view illustrative of a first conventional CMOS device including a p-channel MOS field effect transistor with punch through stopper regions.
Figure 2:
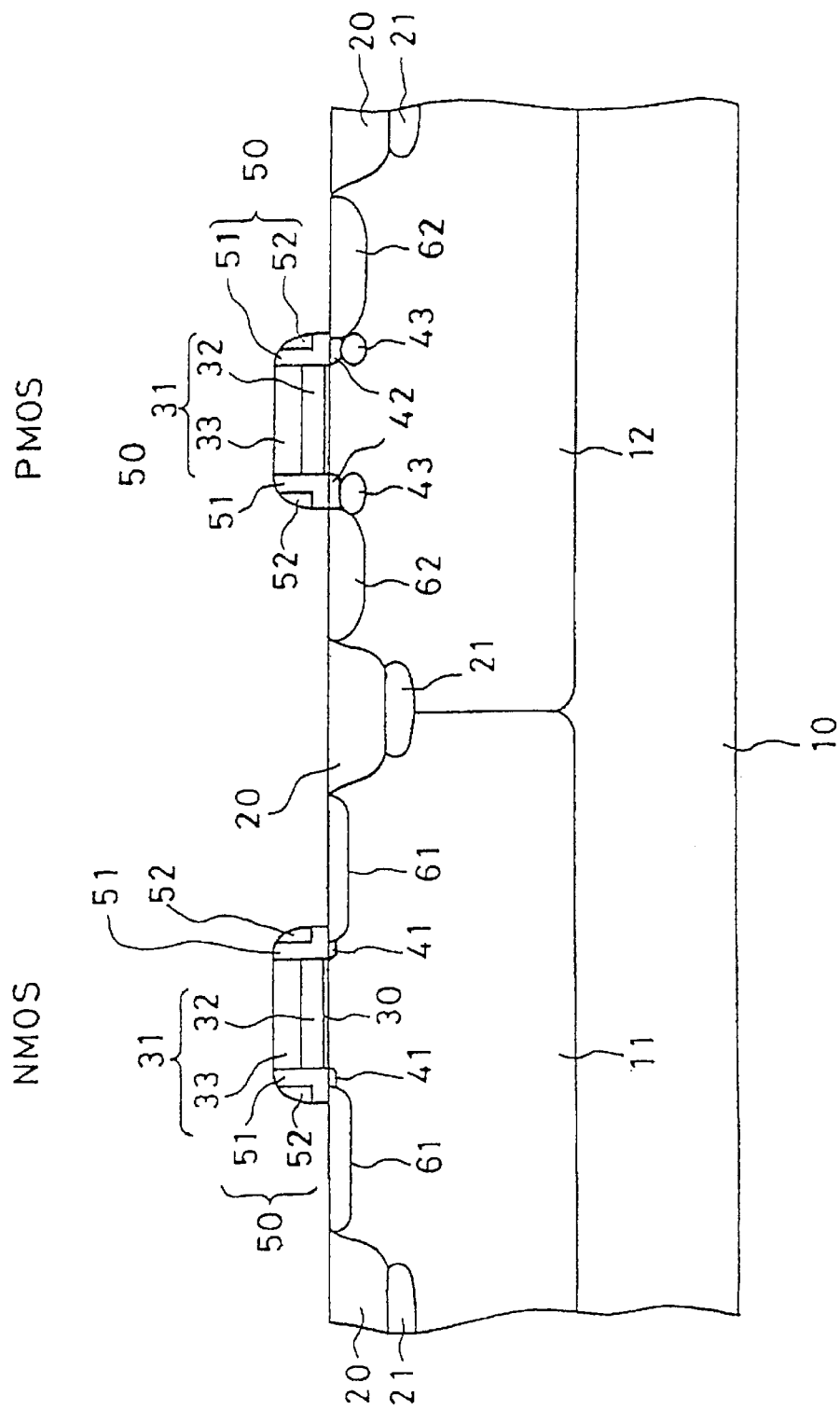
FIG. 2 is a fragmentary cross sectional elevation view illustrative of a second conventional CMOS device including a p-channel MOS field effect transistor with punch through stopper regions.

The first present invention provides a semiconductor device having at least a p-channel MOS field effect transistor and at least an n-channel MOS field effect transistor, both of which are integrated on a single semiconductor substrate. The p-channel MOS field effect transistor has at least a first p-type lightly doped diffusion region adjacent to a p-type drain diffusion region. The n-channel MOS field effect transistor has at least a first n-type lightly doped diffusion region adjacent to an n-type drain diffusion region. The first p-type lightly doped diffusion region of the p-channel MOS field effect transistor is shorter in a direction parallel to a channel length direction than a first n-type lightly doped diffusion region of the n-channel MOS field effect transistor.

It is preferable that a plurality of the p-channel MOS field effect transistors and a plurality of the n-channel MOS field effect transistors are integrated on the single semiconductor substrate, and that at least one of the first p-type lightly doped diffusion region of the p-channel MOS field effect transistor is shorter than every one of the first n-type lightly doped diffusion region of the n-channel MOS field effect transistor.

It is also preferable that a plurality of the p-channel MOS field effect transistors and a plurality of the n-channel MOS field effect transistors are integrated on the single semiconductor substrate, and that any one of the first p-type lightly doped diffusion region of the p-channel MOS field effect transistor is shorter than every one of the first n-type lightly doped diffusion region of the n-channel MOS field effect transistor.

It is also preferable that the semiconductor device has an internal circuit region and an input/output circuit region, and that a plurality of the p-channel MOS field effect transistors and a plurality of the n-channel MOS field effect transistors are integrated in the internal circuit region, and any one of the first p-type lightly doped diffusion region of the p-channel MOS field effect transistor is shorter than every one of the first n-type lightly doped diffusion region of the n-channel MOS field effect transistor.

It is also preferable that the semiconductor device has an internal circuit region and an input/output circuit region, and that a plurality of the p-channel MOS field effect transistors and a plurality of the n-channel MOS field effect transistors are integrated in the input/output circuit region, and any one of the first p-type lightly doped diffusion region of the p-channel MOS field effect transistor is shorter than every one of the first n-type lightly doped diffusion region of the n-channel MOS field effect transistor.

It is also preferable that a second p-type lightly doped diffusion region formed adjacent to a drain region of the p-channel MOS field effect transistor is also shorter in a direction parallel to a channel length direction than a second n-type lightly doped diffusion region formed adjacent to a drain region of the n-channel MOS field effect transistor. In this case, it is also preferable that a plurality of the p-channel MOS field effect transistors and a plurality of the n-channel MOS field effect transistors are integrated on the single semiconductor substrate, and that at least one of the first p-type lightly doped diffusion region of the p-channel MOS field effect transistor is shorter than every one of the first n-type lightly doped diffusion region of the n-channel MOS field effect transistor as well as that any one of the second p-type lightly doped diffusion region of the p-channel MOS field effect transistor is also shorter than every one of the second n-type lightly doped diffusion region of the n-channel MOS field effect transistor. It is further preferable that a plurality of the p-channel MOS field effect transistors and a plurality of the n-channel MOS field effect transistors are integrated on the single semiconductor substrate, and that any one of the first p-type lightly doped diffusion region of the p-channel MOS field effect transistor is shorter than every one of the first n-type lightly doped diffusion region of the n-channel MOS field effect transistor as well as that any one of the second p-type lightly doped diffusion region of the p-channel MOS field effect transistor is also shorter than every one of the second n-type lightly doped diffusion region of the n-channel MOS field effect transistor. It is further more preferable that the semiconductor device has an internal circuit region and an input/output circuit region, and a plurality of the p-channel MOS field effect transistors and a plurality of the n-channel MOS field effect transistors are integrated on the internal circuit region, and that any one of the first p-type lightly doped diffusion region of the p-channel MOS field effect transistor is shorter than every one of the first n-type lightly doped diffusion region of the n-channel MOS field effect transistor as well as wherein any one of the second p-type lightly doped diffusion region of the p-channel MOS field effect transistor is also shorter than every one of the second n-type lightly doped diffusion region of the n-channel MOS field effect transistor. It is also preferable that the semiconductor device has an internal circuit region and an input/output circuit region, and a plurality of the p-channel MOS field effect transistors and a plurality of the n-channel MOS field effect transistors are integrated on the input/output circuit region, and that any one of the first p-type lightly doped diffusion region of the p-channel MOS field effect transistor is shorter than every one of the first n-type lightly doped diffusion region of the n-channel MOS field effect transistor as well as that any one of the second p-type lightly doped diffusion region of the p-channel MOS field effect transistor is also shorter than every one of the second n-type lightly doped diffusion region of the n-channel MOS field effect transistor.

It is also preferable that the p-channel and n-channel MOS field effect transistors make a pair in the form of a CMOS circuit in the single semiconductor substrate.

It is also preferable that the p-channel and n-channel MOS field effect transistors are free of any lightly doped diffusion regions adjacent to source regions so that the source regions are adjacent to channel regions, and that the source regions have lower impurity concentrations than that of the drain regions.

It is also preferable that the p-channel and n-channel MOS field effect transistors respectively have second p-type and n-type lightly doped diffusion regions adjacent to source regions, and that the second p-type and n-type lightly doped diffusion regions adjacent to the source regions are shorter than the first p-type and n-type lightly doped diffusion regions adjacent to the drain regions.

It is also preferable that the p-channel MOS field effect transistor has the first p-type lightly doped diffusion region adjacent to the drain region and a second p-type lightly doped diffusion region adjacent to a source region, and the n-channel MOS field effect transistor has the first n-type lightly doped diffusion region adjacent to the drain region and a second n-type lightly doped diffusion region adjacent to a source region, and the first and second p-type lightly doped diffusion regions have the same length as each other as well as the first and second n-type lightly doped diffusion regions have the same length as each other, and that the first and second p-type lightly doped diffusion regions are shorter than the first and second n-type lightly doped diffusion regions. In this case, it is also preferable that the p-channel and n-channel MOS field effect transistors have side walls formed on opposite sides of gate electrodes and each of the side walls comprises a first side wall oxide film on the gate electrode and a second side wall oxide film on the first side wall oxide film, and that the first and second p-type lightly doped diffusion regions have the same length as a thickness of the first side wall oxide film whilst the first and second n-type lightly doped diffusion regions have the same length as a total thickness of the first and second side wall oxide films.

It is also preferable that the p-channel and n-channel MOS field effect transistors have the first p-type lightly doped diffusion region adjacent to the drain region and the first n-type lightly doped diffusion region adjacent to the drain region, and the p-channel and n-channel MOS field effect transistors are free of any lightly doped diffusion regions adjacent to source regions so that the source regions are adjacent to channel regions, and that the source regions have lower impurity concentrations than that of the drain regions as well as that the first p-type lightly doped diffusion region has the same length as a thickness of the first side wall oxide film whilst the first n-type lightly doped diffusion region has the same length as a total thickness of the first and second side wall oxide films.

It is also preferable to further provide a punch through stopper beneath the first p-type lightly doped diffusion region. In this case, it is also preferable to further provide a punch through stopper beneath the second p-type lightly doped diffusion region.

It is also preferable to further provide a punch through stopper beneath the first n-type lightly doped diffusion region. In this case, it is also preferable to further provide a punch through stopper beneath the second n-type lightly doped diffusion region.

The second aspect of the present invention provides a CMOS device comprising a p-channel MOS field effect transistor and an n-channel MOS field effect transistor, both of which are integrated on a single semiconductor substrate. The p-channel MOS field effect transistor has a first p-type lightly doped diffusion region adjacent to a p-type drain diffusion region. The n-channel MOS field effect transistor has a first n-type lightly doped diffusion region adjacent to an n-type drain diffusion region. The first p-type lightly doped diffusion region of the p-channel MOS field effect transistor is shorter in a direction parallel to a channel length direction than a first n-type lightly doped diffusion region of the n-channel MOS field effect transistor.

It is preferable that a second p-type lightly doped diffusion region formed adjacent to a drain region of the p-channel MOS field effect transistor is also shorter in a direction parallel to a channel length direction than a second n-type lightly doped diffusion region formed adjacent to a drain region of the n-channel MOS field effect transistor. In this case, it is further preferable that the p-channel and n-channel MOS field effect transistors are free of any lightly doped diffusion regions adjacent to source regions so that the source regions are adjacent to channel regions, and wherein the source regions have lower impurity concentrations than that of the drain regions.

It is also preferable that the p-channel and n-channel MOS field effect transistors respectively have second p-type and n-type lightly doped diffusion regions adjacent to source regions, and that the second p-type and n-type lightly doped diffusion regions adjacent to the source regions are shorter than the first p-type and n-type lightly doped diffusion regions adjacent to the drain regions.

It is also preferable that the p-channel MOS field effect transistor has the first p-type lightly doped diffusion region adjacent to the drain region and a second p-type lightly doped diffusion region adjacent to a source region, and the n-channel MOS field effect transistor has the first n-type lightly doped diffusion region adjacent to the drain region and a second n-type lightly doped diffusion region adjacent to a source region, and the first and second p-type lightly doped diffusion regions have the same length as each other as well as the first and second n-type lightly doped diffusion regions have the same length as each other, and that the first and second p-type lightly doped diffusion regions are shorter than the first and second n-type lightly doped diffusion regions. In this case, it is farther preferable that the p-channel and n-channel MOS field effect transistors have side walls formed on opposite sides of gate electrodes and each of the side walls comprises a first side wall oxide film on the gate electrode and a second side wall oxide film on the first side wall oxide film, and that the first and second p-type lightly doped diffusion regions have the same length as a thickness of the first side wall oxide film whilst the first and second n-type lightly doped diffusion regions have the same length as a total thickness of the first and second side wall oxide films.

It is also preferable that the p-channel and n-channel MOS field effect transistors have the first p-type lightly doped diffusion region adjacent to the drain region and the first n-type lightly doped diffusion region adjacent to the drain region, and the p-channel and n-channel MOS field effect transistors are free of any lightly doped diffusion regions adjacent to source regions so that the source regions are adjacent to channel regions, and that the source regions have lower impurity concentrations than that of the drain regions as well as that the first p-type lightly doped diffusion region has the same length as a thickness of the first side wall oxide film whilst the first n-type lightly doped diffusion region has the same length as a total thickness of the first and second side wall oxide films.

It is also preferable to further provide a punch through stopper beneath the first p-type lightly doped diffusion region. In this case, it is also preferable to further provide a punch through stopper beneath the second p-type lightly doped diffusion region.

It is also preferable to further provide a punch through stopper beneath the first n-type lightly doped diffusion region. In this case, it is also preferable to further provide a punch through stopper formed beneath the second n-type lightly doped diffusion region.

The third aspect of the present invention provides a method of forming n-type and p-type lightly doped diffusion regions respectively adjacent to n-type and p-type source/drain regions of n-channel and p-channel MOS field effect transistors which are respectively formed in a p-well region and an n-well region on a single semiconductor substrate.

The method comprises the following steps. n-type and p-type lightly doped diffusion regions are selectively formed in the p-well region and the n-well region by use of first and second gate electrodes respectively formed over the p-well and n-well regions as masks. First side wall oxide films are selectively formed on opposite side walls of each of the first and second gate electrodes. A first photo-resist film is selectively formed over the p-well region. p-type source and drain regions are selectively formed in the n-well region by use of the first photo-resist film and the second gate electrode as masks so that the p-type lightly doped diffusion regions remain only under the first side wall oxide films whereby a length of the p-type lightly doped diffusion regions is substantially defined by a thickness of the first side wall oxide film. The first photo-resist film is removed. Second side wall oxide films are selectively formed on the first side wall oxide films having been formed on the opposite side walls of each of the first and second gate electrodes. A second photo-resist film is selectively formed over the n-well region. n-type source and drain regions are selectively formed in the p-well region by use of the second photo-resist film and the first gate electrode as masks so that the n-type lightly doped diffusion regions remain only under laminations of the first and second side wall oxide films whereby a length of the n-type lightly doped diffusion regions is substantially defined by a total thickness of the first and second side wall oxide films, wherein the p-type lightly doped diffusion regions have a shorter length in a direction along a channel length direction than that of the n-type lightly doped diffusion regions.

The fourth aspect of the present invention provides a method of forming n-type and p-type lightly doped diffusion regions respectively adjacent to n-type and p-type source/drain regions of n-channel and p-channel MOS field effect transistors which are respectively formed in a p-well region and an n-well region on a single semiconductor substrate. The method comprises the following steps. A first photo-resist film is selectively formed over the n-well region. n-type lightly doped diffusion region is selectively formed in the p-well region by use of a first gate electrode formed over the p-well region and the first photo-resist film as masks. The first photo-resist film is removed. A second photo-resist film is formed except over a source formation region in the p-well region. An n-type source region is selectively formed in the p-well region by use of the second photo-resist film and the first gate electrode as masks whereby the n-type lightly doped diffusion region on the source formation region is made into the n-type source region. The second photo-resist film is remove. A third photo-resist film is selectively formed over the p-well region. p-type lightly doped diffusion regions are selectively formed in the n-well region by use of a second gate electrode formed over the n-well region and the third photo-resist film as masks. The third photo-resist film is removed. A fourth photo-resist film is formed except over a source formation region in the n-well region. A p-type source region is selectively formed in the n-well region by use of the fourth photo-resist film and the second gate electrode as masks whereby the p-type lightly doped diffusion region on the source formation region is made into the p-type source region. The fourth photo-resist film is removed. First side wall oxide films are formed on opposite side walls of each of the first and second gate electrodes. A fifth photo-resist film is selectively formed over the p-well region. A p-type drain region is selectively formed in the n-well region by use of the fifth photo-resist film and the second gate electrode as masks so that the p-type lightly doped diffusion region remains only under the first side wall oxide film in the vicinity of the p-type drain region whereby a length of the p-type lightly doped diffusion region is substantially defined by a thickness of the first side wall oxide film. The fifth photo-resist film is removed. Second side wall oxide films are selectively formed on the first side wall oxide films having been formed on the opposite side walls of each of the first and second gate electrodes. A sixth photo-resist film is selectively formed over the n-well region. An n-type drain region is selectively formed in the p-well region by use of the sixth photo-resist film and the first gate electrode as masks so that the n-type lightly doped diffusion region remains only under laminations of the first and second side wall oxide films in the vicinity of the n-type drain region whereby a length of the n-type lightly doped diffusion region is substantially defined by a total thickness of the first and second side wall oxide films, wherein the p-type lightly doped diffusion region has a shorter length in a direction along a channel length direction than that of the n-type lightly doped diffusion region.

The above present inventions will be described in detail and more concretely as follows with reference to the accompanying drawings when the present inventions are applied to the CMOS device is formed on a p-channel semiconductor substrate 10.

Figure 3A:
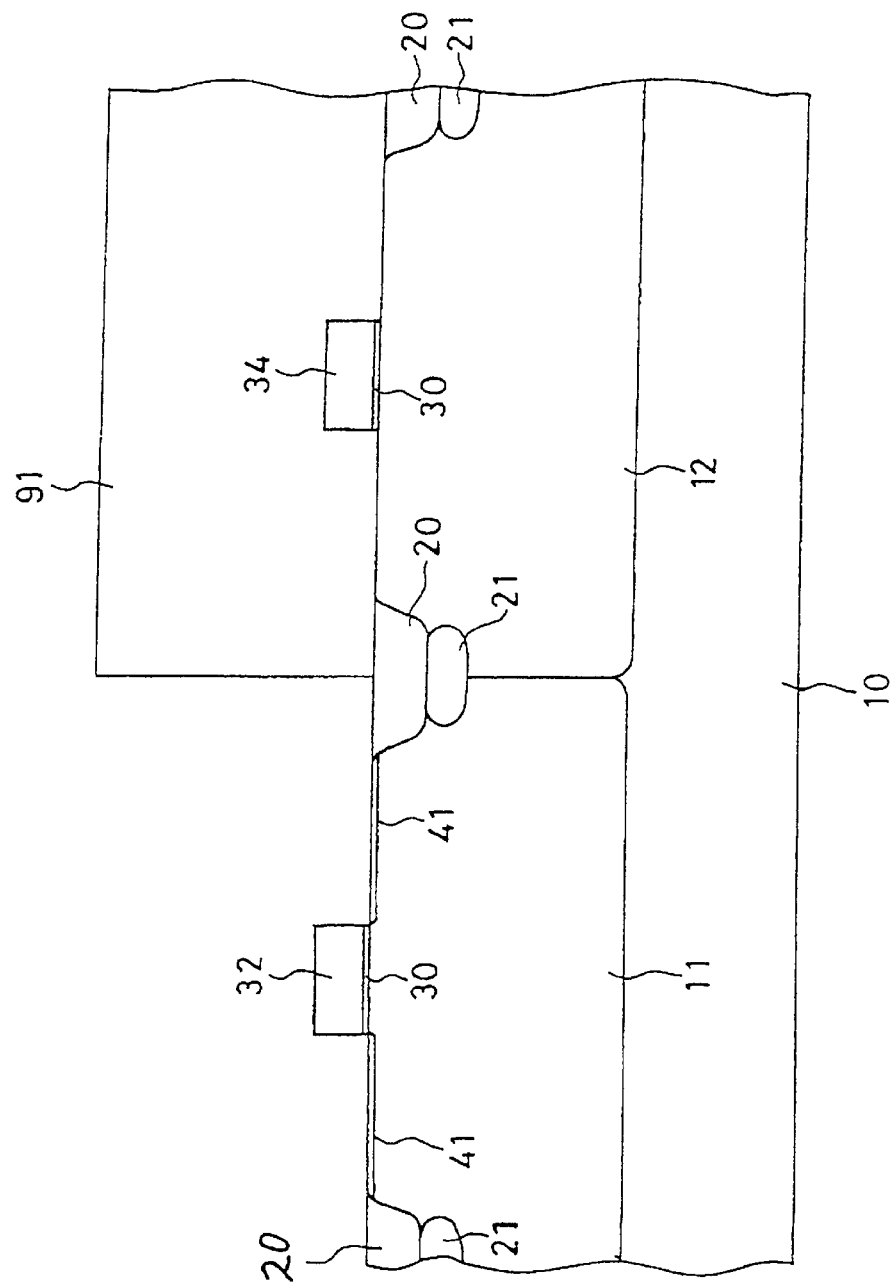
FIGS. 3A through 3G are fragmentary cross sectional elevation views illustrative of a novel method of forming a CMOS device having sufficiently wide punch through layers of the p-channel MOS field effect transistor for preventing the punch through and sufficiently shortened lightly doped drain layers of the n-channel MOS field effect transistors for reduction in parasitic capacitance to improve the driving ability for high speed performance in a first embodiment in accordance with the present invention.

With reference to FIG. 3A, field oxide films 20 having a thickness of about 300–800 nanometers are selectively formed over a surface of the p-channel semiconductor substrate 10 to define active regions of the p-channel semiconductor substrate 10. Further, a p-type impurity such as boron is selectively ion-implanted at a dose of 3E11 to 2E12 $cm^{-2}$ into regions under the field oxide films 20 thereby forming p-type channel stoppers 21. A p-well region 11 and an n-well region 12 are formed in an upper region of the p-channel semiconductor substrate 10. The p-well region 11 is selectively formed by a selective ion-implantation of a p-type impurity such as boron into the p-channel semiconductor substrate 10. On the other hand, the n-well region 12 is selectively formed by a selective ion-implantation of an n-type impurity such as phosphorus or arsenic into the p-channel semiconductor substrate 10. Those ion-implantations may be carried out by separately several times by changing the ion-implantation energy and dose so as to optimize the impurity concentrations of the channel regions under the gate oxide films and the deeper regions of the p-type an n-type well regions. For example, the ion-implantation of the p-type impurity such as boron to form the p-well region may be carried out by separate three steps of the ion-implantation as follows. In the first step, boron is ion-implanted at an ion-implantation energy of 15–40 keV at a dose of 1E12–7E12 $cm^{-2}$. In the second step, boron is ion-implanted at an ion-implantation energy of 40–80 keV at a dose of 2E12–9E12 $cm^{-2}$. In the third step, boron is ion-implanted at an ion-implantation energy of 80–200 keV at a dose of 1E12–7E12 $cm^{-2}$. The ion-implantation of the n-type impurity such as phosphorus or arsenic to form the n-well region may be carried out by separate three steps of the ion-implantation as follows. In the first step, phosphorus or arsenic is ion-implanted at an ion-implantation energy of 30–100 keV at a dose of 1E12–7E12 $cm^{-2}$. In the second step, phosphorus or arsenic is ion-implanted at an ion-implantation energy of 80–200 keV at a dose of 1E12–7E12 $cm^{-2}$. In the third step, phosphorus or arsenic is ion-implanted at an ion-implantation energy of 200–350 keV at a dose of 1E12–7E12 $cm^{-2}$.

A heat treatment is carried out at a temperature in the range of 800–1000° C. for 20–60 minutes to activate the doped impurities into the substrate 10 whereby p-well and n-well regions 11 and 12 are formed in an upper region of the p-type semiconductor substrate 10.

A gate oxide film 30 having a thickness of about 5–8 nanometers is formed which extends over the p-well region 11 and the n-well region 12 as well as over the field oxide films 20. A polysilicon layer having a thickness of about 100–400 nanometers is formed which extends over an entire surface of the substrate, namely covers the gate oxide film 30 over the p-well region 11 and the n-well region 12. An n+-type impurity such as phosphorus or arsenic is heavily and selectively doped into the polysilicon layer over the p-well region 11 thereby to form an n+-type polysilicon layer 32 over the p-well region 11, whilst a p+-type impurity such as boron is heavily and selectively doped into the polysilicon layer over the n-well region 12 thereby to form a p+-type polysilicon layer 34 over the n-well region 12. The heavily doped n+-type and p+-type polysilicon layers 32 and 34 are patterned by a photo-lithography technique to thereby form a gate electrode 32 over the p-well region 11 and a gate electrode 34 over the n-well region 12. A photo-resist film 91 is selectively provided over the n-well region 12 so that an n-type impurity such as phosphorus or arsenic is selectively ion-implanted at an ion-implantation energy of 15–50 keV and a dose of 1E13–3E14 cm$^{-2}$ into the p-well region 11 by use of the n+-type polysilicon film 32 and the field oxide films 20 as masks whereby lightly doped drain n--type diffusion layers 41 are formed in the p-well region 11. It may be possible to carry out an ion-implantation of a p-type impurity such as boron or boron fluoride more deeply than the n-type impurity into the p-well region under the lightly doped drain n--type diffusion layers 41 thereby forming p-type punch through stoppers in the p-well region 11 and under the lightly doped drain n--type diffusion layers 41.

Figure 3B:
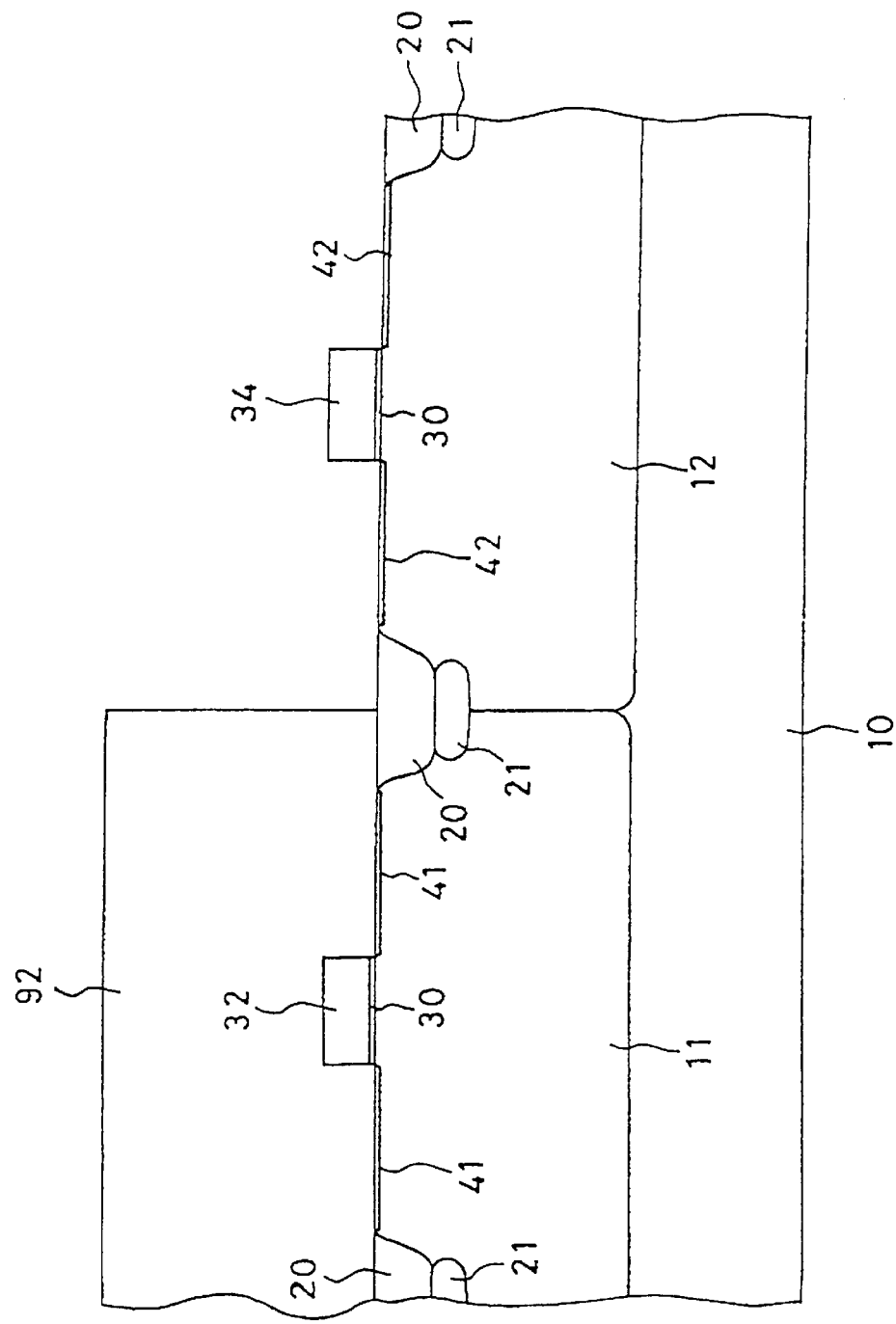

With reference to FIG. 3B, the used photo-resist film 91 is removed. Another photo-resist film 92 is selectively formed over the p-well region 11 so that a p-type impurity such as boron or boron fluoride is also selectively ion-implanted at an ion-implantation energy of 15–50 keV and a dose of 1E12–3E13 cm$^{-2}$ into the n-well region 12 by use of the p+-type polysilicon film 34 and the field oxide films 20 as masks whereby lightly doped drain p--type diffusion layers 42 are formed in the n-well region 12. It may be possible to carry out an ion-implantation of an n-type impurity such as phosphorus or arsenic more deeply than the p-type impurity into the n-well region under the lightly doped drain p--type diffusion layers 42 thereby forming n-type punch through stoppers in the n-well region 12 and under the lightly doped drain p--type diffusion layers 42.

Figure 3C:
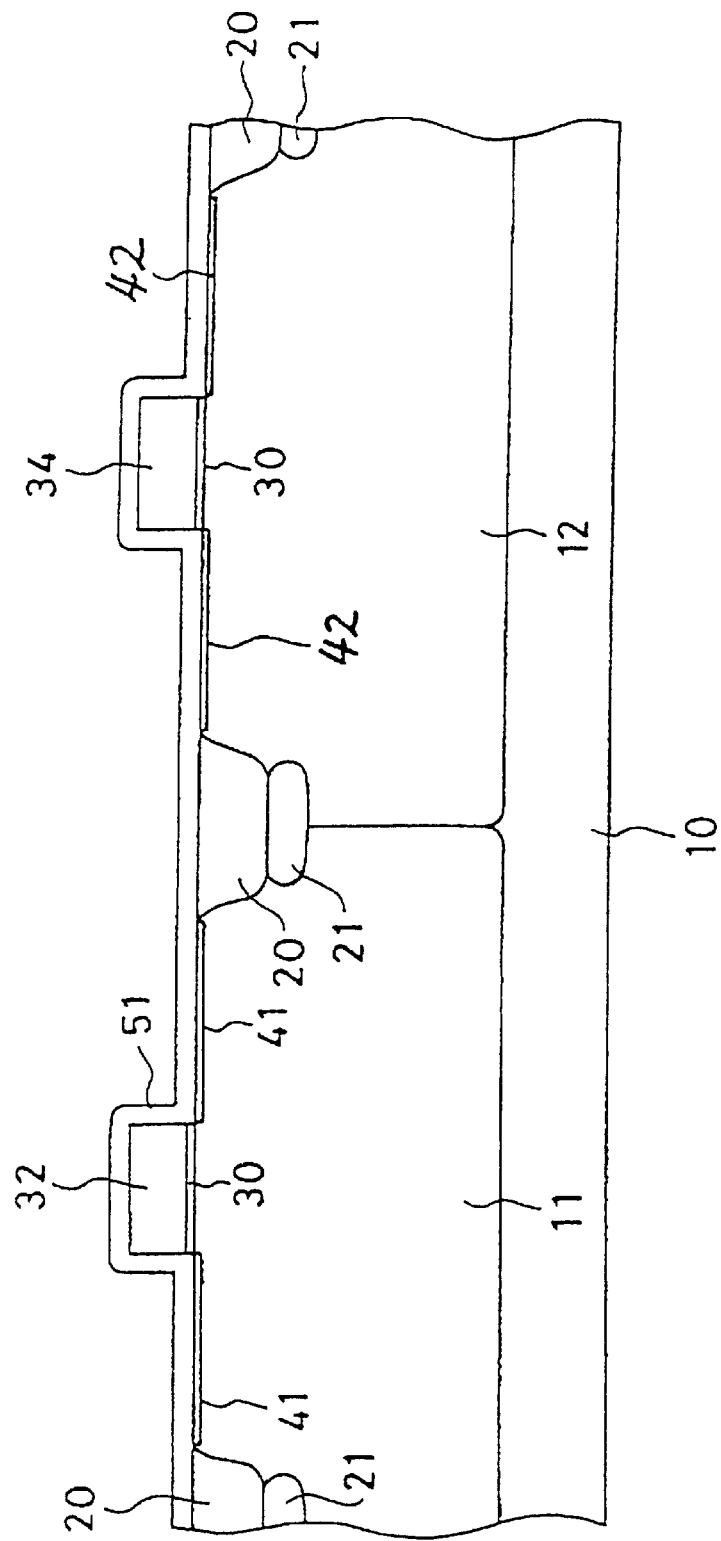

With reference to FIG. 3C, a hot temperature oxide film 51 which possesses a good step coverage is entirely formed which extends over the n+-type polysilicon film 32, the p+-type polysilicon film 34, the lightly doped drain n--type diffusion layers 41, and the lightly doped drain p--type diffusion layers 42 as well as the field oxide films 20 by a high temperature chemical vapor deposition method. The hot temperature oxide film 51 has a thickness of 30–100 nanometers.

Figure 3D:
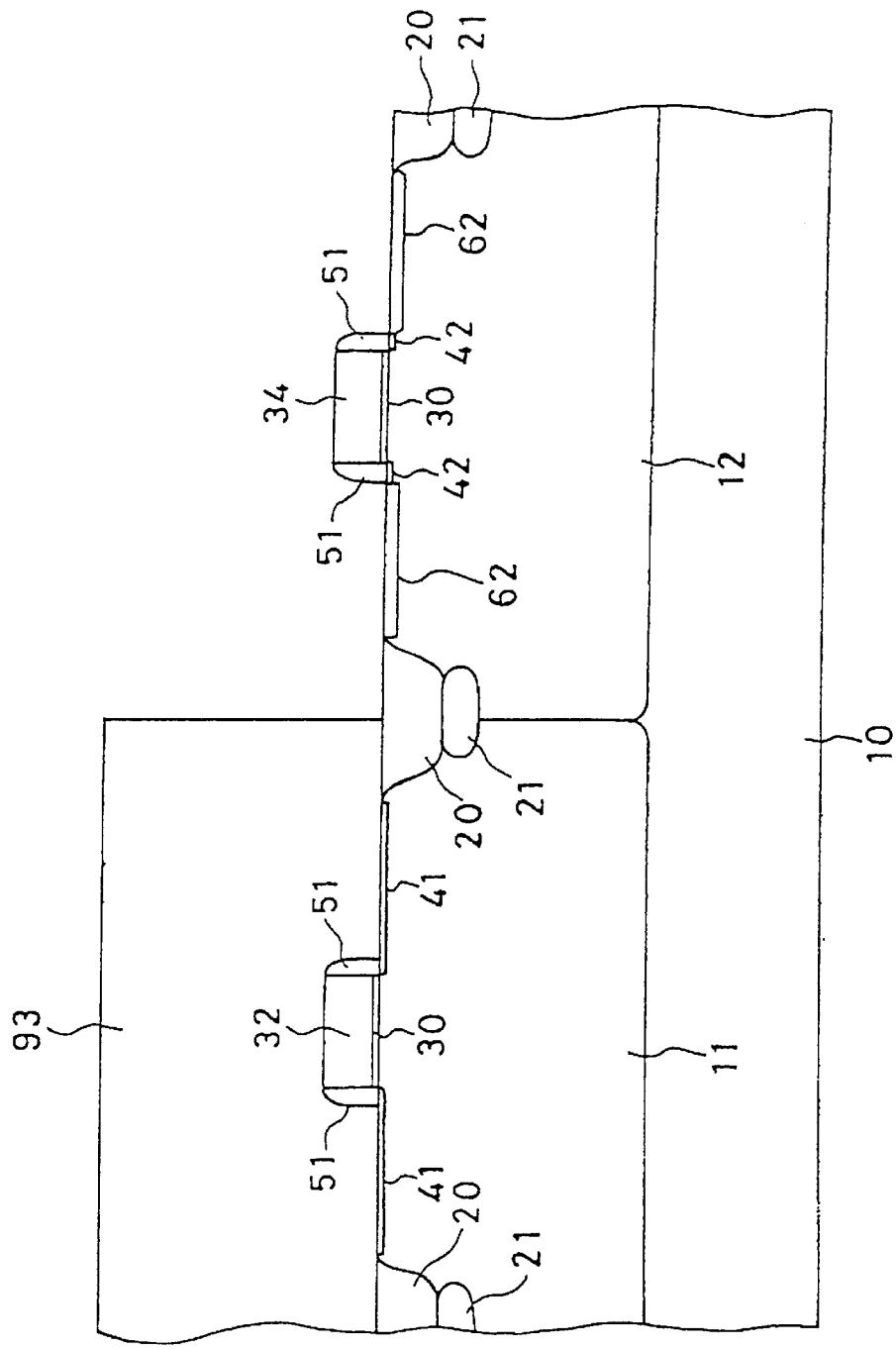

With reference to FIG. 3D, the hot temperature oxide film 51 is then subjected to an etch back to selectively form first side wall oxide films 51 on opposite side walls of each of the n+-type polysilicon film 32 and the p+-type polysilicon film 34. A photo-resist film 93 is selectively formed over the p-well region 11 so that a p-type impurity such as boron or boron fluoride is selectively ion-implanted at an ion-implantation energy of 20–50 keV and a dose of 1E15–5E15 cm$^{-2}$ into the n-well region 12 by use of the field oxide films 20, the p+-type polysilicon film 34 and the first side wall oxide films 51 as masks to selectively form source/drain p+-type diffusion layers 62 in the n-well region 12.

Figure 3E:
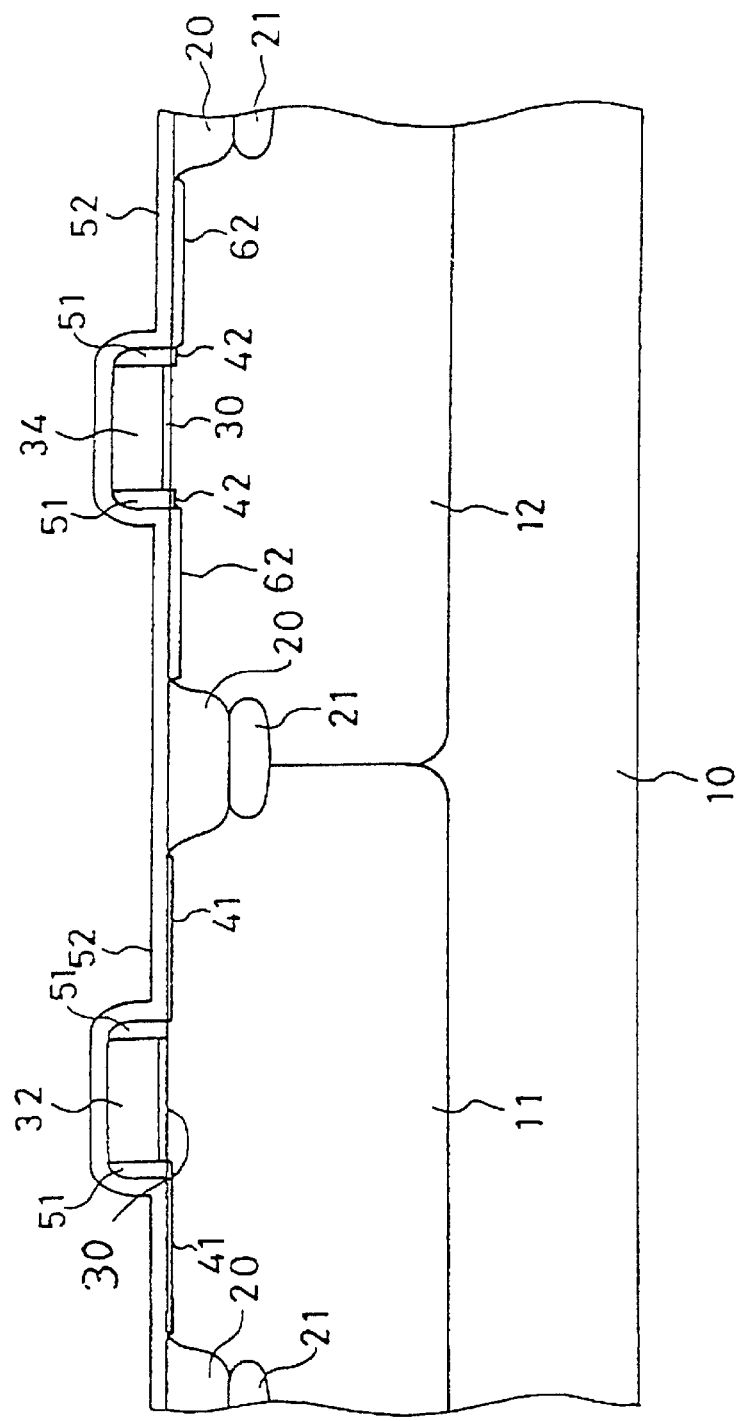

With reference to FIG. 3E, the used photo-resist film 93 is removed. A second hot temperature oxide film 52 which possesses a good step coverage is entirely formed which extends over the n+-type polysilicon film 32, the p+-type polysilicon film 34, the first side wall oxide films 51, the lightly doped drain n--type diffusion layers 41, and the lightly doped drain p--type diffusion layers 42 as well as the field oxide films 20 by a high temperature chemical vapor deposition method. The second hot temperature oxide film 51 has a thickness of 30–100 nanometers.

Figure 3F:
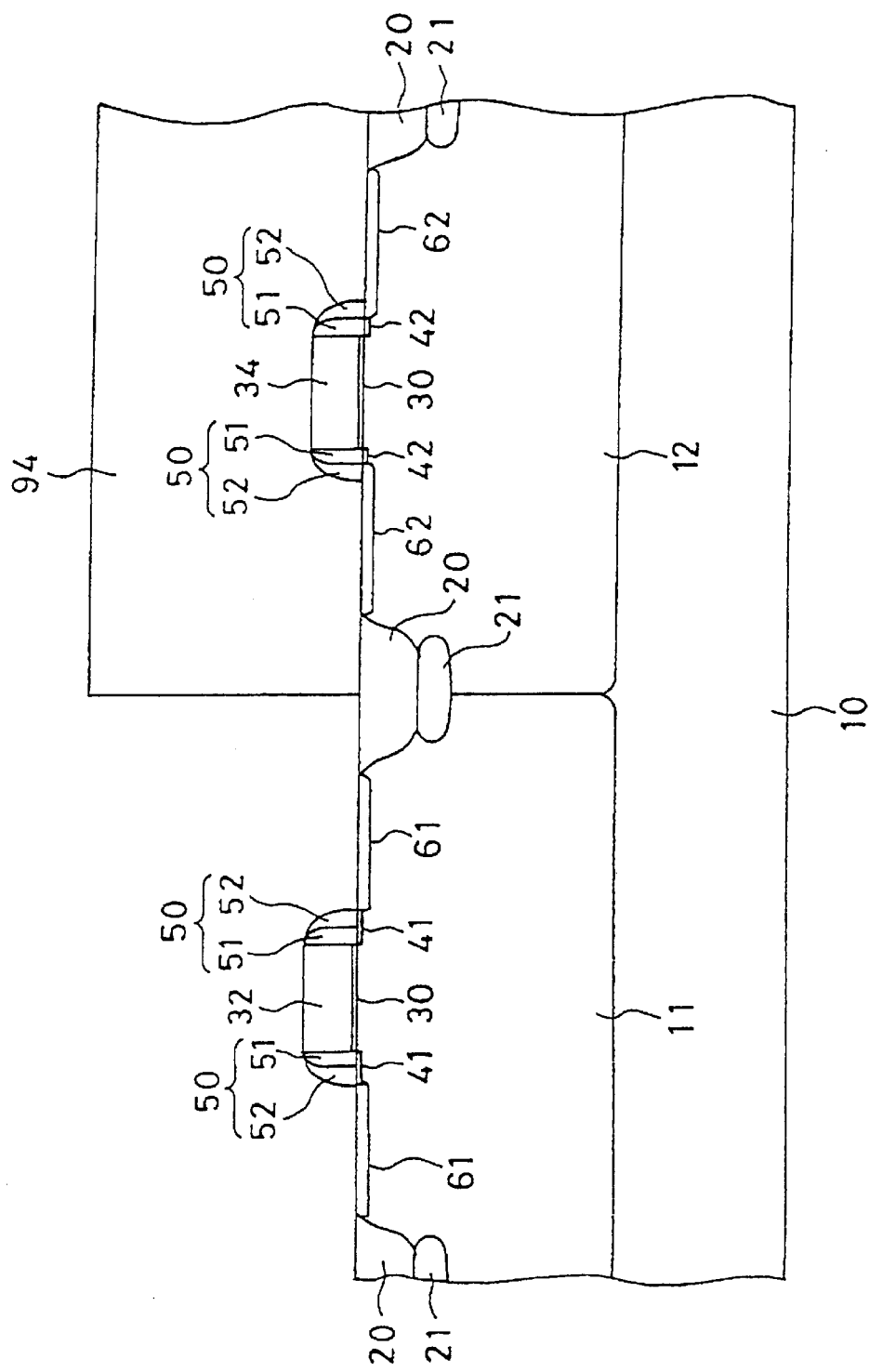

With reference to FIG. 3F, the second hot temperature oxide film 52 is then subjected to an etch back to selectively form second side wall oxide films 52 on the side wall oxide films 51 of each of the n+-type polysilicon film 32 and the p+-type polysilicon film 34 whereby side walls are formed on opposite side walls of each of the n+-type polysilicon film 32 and the p+-type polysilicon film 34, wherein the side walls 50 comprise laminations of the first and second side wall oxide films 51 and 52. A photo-resist film 94 is selectively formed over the n-well region 12 so that an n-type impurity such as phosphorus or arsenic is selectively ion-implanted at an ion-implantation energy of 20–60 keV and a dose of 1E15–5E15 cm$^{-2}$ into the p-well region 11 by use of the field oxide films 20, the n+-type polysilicon film 32 and the side walls 50 as masks to selectively form source/drain n+-type diffusion layers 61 in the p-well region 11.

Figure 3G:
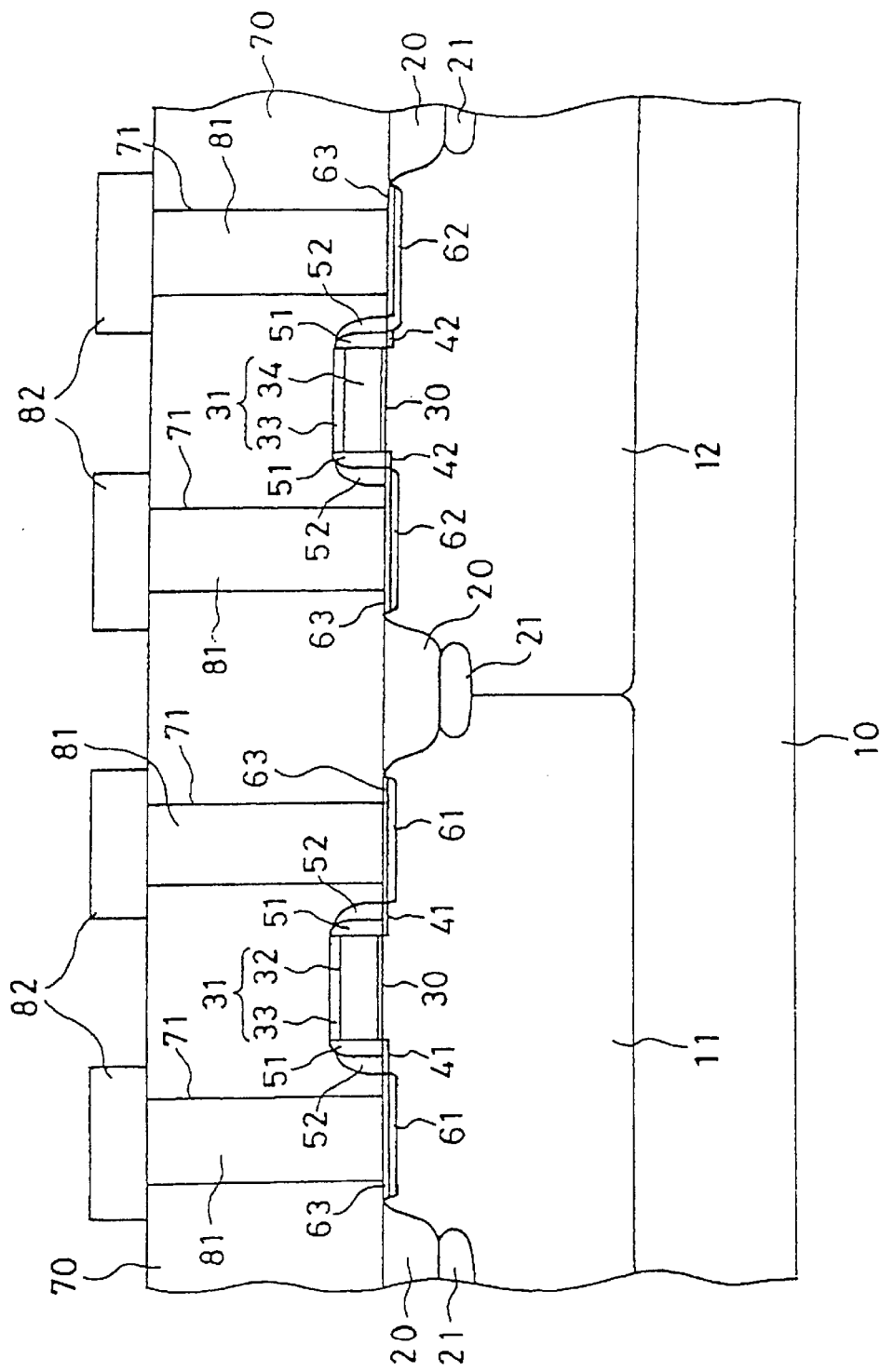

With reference to FIG. 3G, a refractory metal layer such as a titanium layer having a thickness of about 20–100 nanometers is entirely deposited by a sputtering method over the n+-type polysilicon film 32 and the p+-type polysilicon film 34, the side walls 50, the source/drain n+-type diffusion layers 61 and the source/drain p+-type diffusion layers 62 as well as the field oxide films 20. Subsequently, a heat treatment is carried out to cause a silicidation reaction of silicon with refractory metal such as titanium so that refractory metal silicide layers 33 are formed in the upper regions of the n+-type polysilicon film 32 and the p+-type polysilicon film 34 as well as other refractory metal silicide layers 63 are formed in the upper regions of the source/drain n+-type diffusion layers 61 and also in the upper regions of the source/drain p+-type diffusion layers 62. As a result, gate electrodes 31 are formed over the p-well region 11 and the n-well region 12 wherein the gate electrode 31 over the p-well region 11 comprises the n+-type polysilicon film 32 and the refractory metal silicide layer 33 whilst the gate electrode 31 over the n-well region 12 comprises the p+-type polysilicon film 34 and the refractory metal silicide layer 33. The unreacted refractory metal layer is removed. An inter-layer insulator 70 is entirely formed which covers the gate electrodes 31, the side walls 50, and the refractory metal suicide layers 63 over the source/drain n+-type and p+-type diffusion layers 61 and 62 as well as the field oxide films 20. The inter-layer insulator 70 may comprise laminations of a tetraethylorthosilicate film and a borophosphosiliciate glass film. The inter-layer insulator 70 has a thickness of about 800–1500 nanometers. Subsequently, a high temperature and short time lamp anneal is carried out at a temperature of 800–1100° C. for 10–60 seconds to activate the impurities without, however, causing the diffusion of the impurities so that lightly doped drain diffusion layers and the source/drain layers, both of which are shallow.

Contact holes 71 are selectively formed in the inter-layer insulator 70 so that the contact holes 71 are positioned over the refractory metal silicide layers 63 over the source/drain n+-type and p+-type diffusion layers 61 and 62. As a result, parts of the refractory metal silicide layers 63 over the source/drain n+-type and p+-type diffusion layers 61 and 62 are shown through the contact holes 71. Refractory metal contact plug layers 81 such as tungsten contact plug layers are selectively formed within the contact holes 71 so that the refractory metal contact plug layers 81 are made into contact with the refractory metal silicide layers 63 over the source/drain n+-type and p+-type diffusion layers 61 and 62. An interconnection layer 82 is entirely formed over the interlayer insulator 70 and over the refractory metal contact plug layers 81. The interconnection layer 82 comprises an aluminum film or a film of aluminum and copper alloy. The interconnection layer 82 has a thickness of 300–800 nanometers. As a result, the CMOS device is completed.

As well illustrated in FIG. 3F, the lightly doped drain n--type diffusion layers 41 formed in the p-well region 11 is longer than the lightly doped drain p--type diffusion layers 42 in the n-well region 12. Namely, the lightly doped drain p--type diffusion layers 42 of the p-channel MOS field effect transistor in the n-well region 12 has a shorter length than that of the lightly doped drain n--type diffusion layers 41 of the p-channel MOS field effect transistor in the p-well region 11. The length of the lightly doped drain p--type diffusion layers 42 in the n-well region 12 is substantially defined by the thickness of the first side wall oxide film 51, whilst the length of the lightly doped drain n--type diffusion layers 41 formed in the p-well region 11 is substantially defined by the total thickness of the first and second side wall oxide films 51 and 52. The ratio in length of the lightly doped drain n--type diffusion layers 41 to the lightly doped drain p--type diffusion layers 42 may be decided by the ratio in thickness of the first side wall oxide film 51 and the laminations of the first and second side wall oxide films 51 and 52. A difference in length of the lightly doped drain p--type diffusion layers 42 from the lightly doped drain n--type diffusion layers 41 substantially corresponds to the thickness of the second side wall oxide film 52.

Electrons are carriers for the n-channel MOS field effect transistor formed in the p-well region 11 whilst holes are carriers for the p-channel MOS field effect transistor formed in the n-well region 12. Since an electron is much smaller in mass than a hole, electron injection is caused at a higher speed than hole injection under the same electric field. Namely, if the field relaxation at the lightly doped drain regions is almost the same between the n-channel and p-channel MOS field effect transistors, the probability of causing the hot carrier in the n-channel MOS field effect transistor is higher than that of the p-channel MOS field effect transistor. In order to provide the n-channel and p-channel MOS field effect transistors with the same resistively to the hot carrier, the field concentration at the lightly doped drain region of the n-channel MOS field effect transistor is largely relaxed as compared to the p-channel MOS field effect transistor. On the other hand, since the probability of causing the hot carrier in the p-channel MOS field effect transistor is lower than that of the n-channel MOS field effect transistor, then the length of the lightly doped drain regions of the p-channel MOS field effect transistor is made shorter than that of the n-channel MOS field effect transistor so as to reduce the parasitic capacitance of the lightly doped drain regions of the p-channel MOS field effect transistor whereby the driving ability of the p-channel MOS field effect transistor is improved.

Accordingly, of the novel CMOS devices, both the p-channel and n-channel MOS field effect transistors are capable of suppressing the punch through and have reduced parasitic capacitance of the lightly doped drain regions to improve the driving ability for high speed performance.

PREFERRED EMBODIMENTS

FIRST EMBODIMENT

A first embodiment according to the present invention will be described in detail with reference to FIGS. 3A through 3F. The CMOS device is formed on a p-channel semiconductor substrate 10.

With reference to FIG. 3A, field oxide films 20 having a thickness of 400 nanometers are selectively formed over a surface of the p-channel semiconductor substrate 10 to define active regions of the p-channel semiconductor substrate 10. Further, a p-type impurity such as boron is selectively ion-implanted at a dose of 1E12 $cm^{-2}$ into regions under the field oxide films 20 thereby forming p-type channel stoppers 21. A p-well region 11 and an n-well region 12 are formed in an upper region of the p-channel semiconductor substrate 10. The p-well region 11 is selectively formed by a selective ion-implantation of a p-type impurity such as boron into the p-channel semiconductor substrate 10. On the other hand, the n-well region 12 is selectively formed by a selective ion-implantation of an n-type impurity such as phosphorus or arsenic into the p-channel semiconductor substrate 10. Those ion-implantations are carried out by separately three steps. For example, the ion-implantation of boron to form the p-well region is carried out by separate three steps of the ion-implantation as follows. In the first step, boron is ion-implanted at an ion-implantation energy of 25 keV at a dose of 3E12 $cm^{-2}$. In the second step, boron is ion-implanted at an ion-implantation energy of 60 keV at a dose of 5E12 $cm^{-2}$. In the third step, boron is ion-implanted at an ion-implantation energy of 150 keV at a dose of 3E12 $cm^{-2}$. The ion-implantation of phosphorus to form the n-well region may be carried out by separate three steps of the ion-implantation as follows. In the first step, phosphorus is ion-implanted at an ion-implantation energy of 60 keV at a dose of 4E12 $cm^{-2}$. In the second step, phosphorus is ion-implanted at an ion-implantation energy of 130 keV at a dose of 3E12 $cm^{-2}$. In the third step, phosphorus is ion-implanted at an ion-implantation energy of 250 keV at a dose of 2E12 $cm^{-2}$.

A heat treatment is carried out at a temperature in the range of 900° C. for 30 minutes to activate the doped impurities into the substrate 10 whereby p-well and n-well regions 11 and 12 are formed in an upper region of the p-type semiconductor substrate 10.

A gate oxide film 30 having a thickness of about 6 nanometers is formed which extends over the p-well region 11 and the n-well region 12 as well as over the field oxide films 20. A polysilicon layer having a thickness of 200 nanometers is formed which extends over an entire surface of the substrate, namely covers the gate oxide film 30 over the p-well region 11 and the n-well region 12. An n+-type impurity such as phosphorus or arsenic is heavily and selectively doped into the polysilicon layer over the p-well region 11 thereby to form an n+-type polysilicon layer 32 over the p-well region 11, whilst a p+-type impurity such as boron is heavily and selectively doped into the polysilicon layer over the n-well region 12 thereby to form a p+-type polysilicon layer 34 over the n-well region 12. The heavily doped n+-type and p+-type polysilicon layers 32 and 34 are patterned by a photo-lithography technique to thereby form a gate electrode 32 over the p-well region 11 and a gate electrode 34 over the n-well region 12. A photo-resist film 91 is selectively provided over the n-well region 12 so that an n-type impurity such as phosphorus or arsenic is selectively ion-implanted at an ion-implantation energy of 25 keV and a dose of 2E14 cm$^{-2}$ into the p-well region 11 by use of the n+-type polysilicon film 32 and the field oxide films 20 as masks whereby lightly doped drain n--type diffusion layers 41 are formed in the p-well region 11.

With reference to FIG. 3B, the used photo-resist film 91 is removed. Another photo-resist film 92 is selectively formed over the p-well region 11 so that a p-type impurity such as boron or boron fluoride is also selectively ion-implanted at an ion-implantation energy of 25 keV and a dose of 1E13 cm$^{-2}$ into the n-well region 12 by use of the p+-type polysilicon film 34 and the field oxide films 20 as masks whereby lightly doped drain p--type diffusion layers 42 are formed in the n-well region 12. Concurrently, another ion-implantation of phosphorus is carried out into the n-well region under the lightly doped drain p--type diffusion layers 42 thereby forming p-type punch through stoppers not illustrated in the n-well region 12 and under the lightly doped drain p--type diffusion layers 42.

With reference to FIG. 3C, a hot temperature oxide film 51 which possesses a good step coverage is entirely formed which extends over the n+-type polysilicon film 32, the p+-type polysilicon film 34, the lightly doped drain n--type diffusion layers 41, and the lightly doped drain p--type diffusion layers 42 as well as the field oxide films 20 by a high temperature chemical vapor deposition method. The hot temperature oxide film 51 has a thickness of 70 nanometers.

With reference to FIG. 3D, the hot temperature oxide film 51 is then subjected to an etch back to selectively form first side wall oxide films 51 on opposite side walls of each of the n+-type polysilicon film 32 and the p+-type polysilicon film 34. A photo-resist film 93 is selectively formed over the p-well region 11 so that a p-type impurity such as boron fluoride is selectively ion-implanted at an ion-implantation energy of 35 keV and a dose of 3E15 cm$^{-2}$ into the n-well region 12 by use of the field oxide films 20, the p+-type polysilicon film 34 and the first side wall oxide films 51 as masks to selectively form source/drain p+-type diffusion layers 62 in the n-well region 12.

With reference to FIG. 3E, the used photo-resist film 93 is removed. A second hot temperature oxide film 52 which possesses a good step coverage is entirely formed which extends over the n+-type polysilicon film 32, the p+-type polysilicon film 34, the first side wall oxide films 51, the lightly doped drain n--type diffusion layers 41, and the lightly doped drain p--type diffusion layers 42 as well as the field oxide films 20 by a high temperature chemical vapor deposition method. The second hot temperature oxide film 51 has a thickness of 50 nanometers.

With reference to FIG. 3F, the second hot temperature oxide film 52 is then subjected to an etch back to selectively form second side wall oxide films 52 on the side wall oxide films 51 of each of the n+-type polysilicon film 32 and the p+-type polysilicon film 34 whereby side walls are formed on opposite side walls of each of the n+-type polysilicon film 32 and the p+-type polysilicon film 34, wherein the side walls 50 comprise laminations of the first and second side wall oxide films 51 and 52. A photo-resist film 94 is selectively formed over the n-well region 12 so that arsenic is selectively ion-implanted at an ion-implantation energy of 40 keV and a dose of 3E15 cm$^{-2}$ into the p-well region 11 by use of the field oxide films 20, the n+-type polysilicon film 32 and the side walls 50 as masks to selectively form source/drain n+-type diffusion layers 61 in the p-well region 11.

With reference to FIG. 3G, a refractory metal layer such as a titanium layer having a thickness of 50 nanometers is entirely deposited by a sputtering method over the n+-type polysilicon film 32 and the p+-type polysilicon film 34, the side walls 50, the source/drain n+-type diffusion layers 61 and the source/drain p+-type diffusion layers 62 as well as the field oxide films 20. Subsequently, a heat treatment is carried out to cause a silicidation reaction of silicon with refractory metal such as titanium so that refractory metal silicide layers 33 are formed in the upper regions of the n+-type polysilicon film 32 and the p+-type polysilicon film 34 as well as other refractory metal silicide layers 63 are formed in the upper regions of the source/drain n+-type diffusion layers 61 and also in the upper regions of the source/drain p+-type diffusion layers 62. As a result, gate electrodes 31 are formed over the p-well region 11 and the n-well region 12 wherein the gate electrode 31 over the p-well region 11 comprises the n+-type polysilicon film 32 and the refractory metal silicide layer 33 whilst the gate electrode 31 over the n-well region 12 comprises the p+-type polysilicon film 34 and the refractory metal silicide layer 33. The unreacted refractory metal layer is removed. An inter-layer insulator 70 is entirely formed which covers the gate electrodes 31, the side walls 50, and the refractory metal silicide layers 63 over the source/drain n+-type and p+-type diffusion layers 61 and 62 as well as the field oxide films 20. The inter-layer insulator 70 may comprise laminations of a tetra-ethylorthosilicate film and a borophosphosiliciate glass film. The inter-layer insulator 70 has a thickness of 1000 nanometers. Subsequently, a high temperature and short time lamp anneal is carried out at a temperature of 1000° C. for 30 seconds to activate the impurities without, however, causing the diffusion of the impurities so that lightly doped drain diffusion layers and the source/drain layers, both of which are shallow.

Contact holes 71 are selectively formed in the inter-layer insulator 70 so that the contact holes 71 are positioned over the refractory metal silicide layers 63 over the source/drain n+-type and p+-type diffusion layers 61 and 62. As a result, parts of the refractory metal silicide layers 63 over the source/drain n+-type and p+-type diffusion layers 61 and 62 are shown through the contact holes 71. Tungsten contact plug layers 81 are selectively formed within the contact holes 71 so that the tungsten contact plug layers 81 are made into contact with the refractory metal silicide layers 63 over the source/drain n+-type and p+-type diffusion layers 61 and 62. An aluminum interconnection layer 82 having a thickness of 500 nanometers is entirely formed over the inter-layer insulator 70 and over the refractory metal contact plug layers 81. As a result, the CMOS device is completed.

As well illustrated in FIG. 3F, the lightly doped drain n--type diffusion layers 41 formed in the p-well region 11 has a longer than the lightly doped drain p--type diffusion layers 42 in the n-well region 12. Namely, the lightly doped drain p--type diffusion layers 42 of the p-channel MOS field effect transistor in the n-well region 12 has a shorter length than that of the lightly doped drain n--type diffusion layers 41 of the p-channel MOS field effect transistor in the p-well region 11. The length of the lightly doped drain p--type diffusion layers 42 in the n-well region 12 is substantially defined by the thickness of 70 nanometers of the first side wall oxide film 51, whilst the length of the lightly doped drain n--type diffusion layers 41 formed in the p-well region 11 is substantially defined by the total thickness of 120 nanometers the first and second side wall oxide films 51 and 52. A difference in length of the lightly doped drain p--type diffusion layers 42 from the lightly doped drain n--type diffusion layers 41 substantially corresponds to the thickness of 50 nanometers of the second side wall oxide film 52.

Electrons are carrier for the n-channel MOS field effect transistor formed in the p-well region 11 whilst holes are carrier for the p-channel MOS field effect transistor formed in the n-well region 12. Since electron is much smaller in mass than hole, electron injection is caused at a higher speed than hole injection under the same electric field. Namely, if the field relaxation at the lightly doped drain regions is almost the same between the n-channel and p-channel MOS field effect transistors, the probability of causing the hot carrier in the n-channel MOS field effect transistor is higher than that of the p-channel MOS field effect transistor. In order to provide the n-channel and p-channel MOS field effect transistors with the same resistively to the hot carrier, the field concentration at the lightly doped drain region of the n-channel MOS field effect transistor is largely relaxed as compared to the p-channel MOS field effect transistor. On the other hand, since the probability of causing the hot carrier in the p-channel MOS field effect transistor is lower than that of the n-channel MOS field effect transistor, then the length of the lightly doped drain regions of the p-channel MOS field effect transistor is made shorter than that of the n-channel MOS field effect transistor so as to reduce the parasitic capacitance of the lightly doped drain regions of the p-channel MOS field effect transistor whereby the driving ability of the p-channel MOS field effect transistor is improved.

Accordingly, of the novel CMOS devices, both the p-channel and n-channel MOS field effect transistors are capable of suppressing the punch through and have reduced parasitic capacitance of the lightly doped drain regions to improve the driving ability for high speed performance.

SECOND EMBODIMENT

A second embodiment according to the present invention will be described in detail with reference to FIGS. 4A through 4J.

Figure 4A:
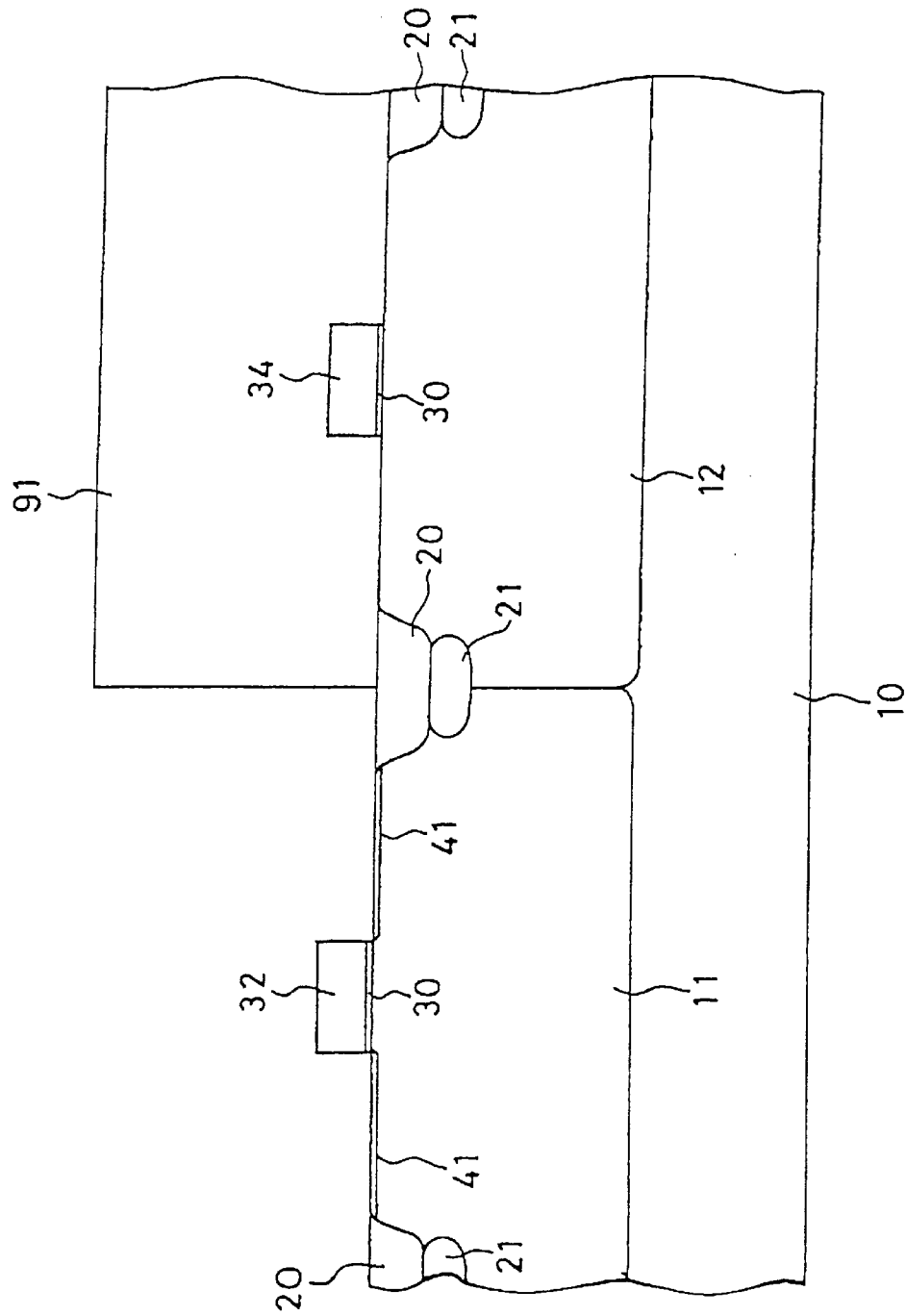
FIGS. 4A through 4J are fragmentary cross sectional elevation views illustrative of a novel method of forming a CMOS device having sufficiently wide punch through layers of the p-channel MOS field effect transistor for preventing the punch through and sufficiently shortened lightly doped drain layers of the n-channel MOS field effect transistors for reduction in parasitic capacitance to improve the driving ability for high speed performance in a second embodiment in accordance with the present invention.

With reference to FIG. 4A, field oxide films 20 having a thickness of about 300–800 nanometers are selectively formed over a surface of the p-channel semiconductor substrate 10 to define active regions of the p-channel semiconductor substrate 10. Further, a p-type impurity such as boron is selectively ion-implanted at a dose of 3E11 to 2E12 $cm^{-2}$ into regions under the field oxide films 20 thereby forming p-type channel stoppers 21. A p-well region 11 and an n-well region 12 are formed in an upper region of the p-channel semiconductor substrate 10. The p-well region 11 is selectively formed by a selective ion-implantation of a p-type impurity such as boron into the p-channel semiconductor substrate 10. On the other hand, the n-well region 12 is selectively formed by a selective ion-implantation of an n-type impurity such as phosphorus or arsenic into the p-channel semiconductor substrate 10. Those ion-implantations may be carried out by separately several times by changing the ion-implantation energy and dose so as to optimize the impurity concentrations of the channel regions under the gate oxide films and the deeper regions of the p-type an n-type well regions. For example, the ion-implantation of the p-type impurity such as boron to form the p-well region may be carried out by separate three steps of the ion-implantation as follows. In the first step, boron is ion-implanted at an ion-implantation energy of 15–40 keV at a dose of 1E12–7E12 $cm^{-2}$. In the second step, boron is ion-implanted at an ion-implantation energy of 40–80 keV at a dose of 2E12–9E12 $cm^{-2}$. In the third step, boron is ion-implanted at an ion-implantation energy of 80–200 keV at a dose of 1E12–7E12 $cm^{-2}$. The ion-implantation of the n-type impurity such as phosphorus or arsenic to form the n-well region may be carried out by separate three steps of the ion-implantation as follows. In the first step, phosphorus or arsenic is ion-implanted at an ion-implantation energy of 30–100 keV at a dose of 1E12–7E12 $cm^{-2}$. In the second step, phosphorus or arsenic is ion-implanted at an ion-implantation energy of 80–200 keV at a dose of 1E12–7E12 $cm^{-2}$. In the third step, phosphorus or arsenic is ion-implanted at an ion-implantation energy of 200–350 keV at a dose of 1E12–7E12 $cm^{-2}$.

A heat treatment is carried out at a temperature in the range of 800–1000° C. for 20–60 minutes to activate the doped impurities into the substrate 10 whereby p-well and n-well regions 11 and 12 are formed in an upper region of the p-type semiconductor substrate 10.

A gate oxide film 30 having a thickness of about 5–8 nanometers is formed which extends over the p-well region 11 and the n-well region 12 as well as over the field oxide films 20. A polysilicon layer having a thickness of about 100–400 nanometers is formed which extends over an entire surface of the substrate, namely covers the gate oxide film 30 over the p-well region 11 and the n-well region 12. An n+-type impurity such as phosphorus or arsenic is heavily and selectively doped into the polysilicon layer over the p-well region 11 thereby to form an n+-type polysilicon layer 32 over the p-well region 11, whilst a p+-type impurity such as boron is heavily and selectively doped into the polysilicon layer over the n-well region 12 thereby to form a p+-type polysilicon layer 34 over the n-well region 12. The heavily doped n+-type and p+-type polysilicon layers 32 and 34 are patterned by a photo-lithography technique to thereby form a gate electrode 32 over the p-well region 11 and a gate electrode 34 over the n-well region 12. A photo-resist film 91 is selectively provided over the n-well region 12 so that an n-type impurity such as phosphorus or arsenic is selectively ion-implanted at an ion-implantation energy of 15–50 keV and a dose of 1E13–3E14 $cm^{-2}$ into the p-well region 11 by use of the n+-type polysilicon film 32 and the field oxide films 20 as masks whereby lightly doped drain n--type diffusion layers 41 are formed in the p-well region 11. It may be possible to carry out an ion-implantation of a p-type impurity such as boron or boron fluoride more deeply than the n-type impurity into the p-well region under the lightly doped drain n--type diffusion layers 41 thereby forming p-type punch through stoppers in the p-well region 11 and under the lightly doped drain n--type diffusion layers 41.

Figure 4B:
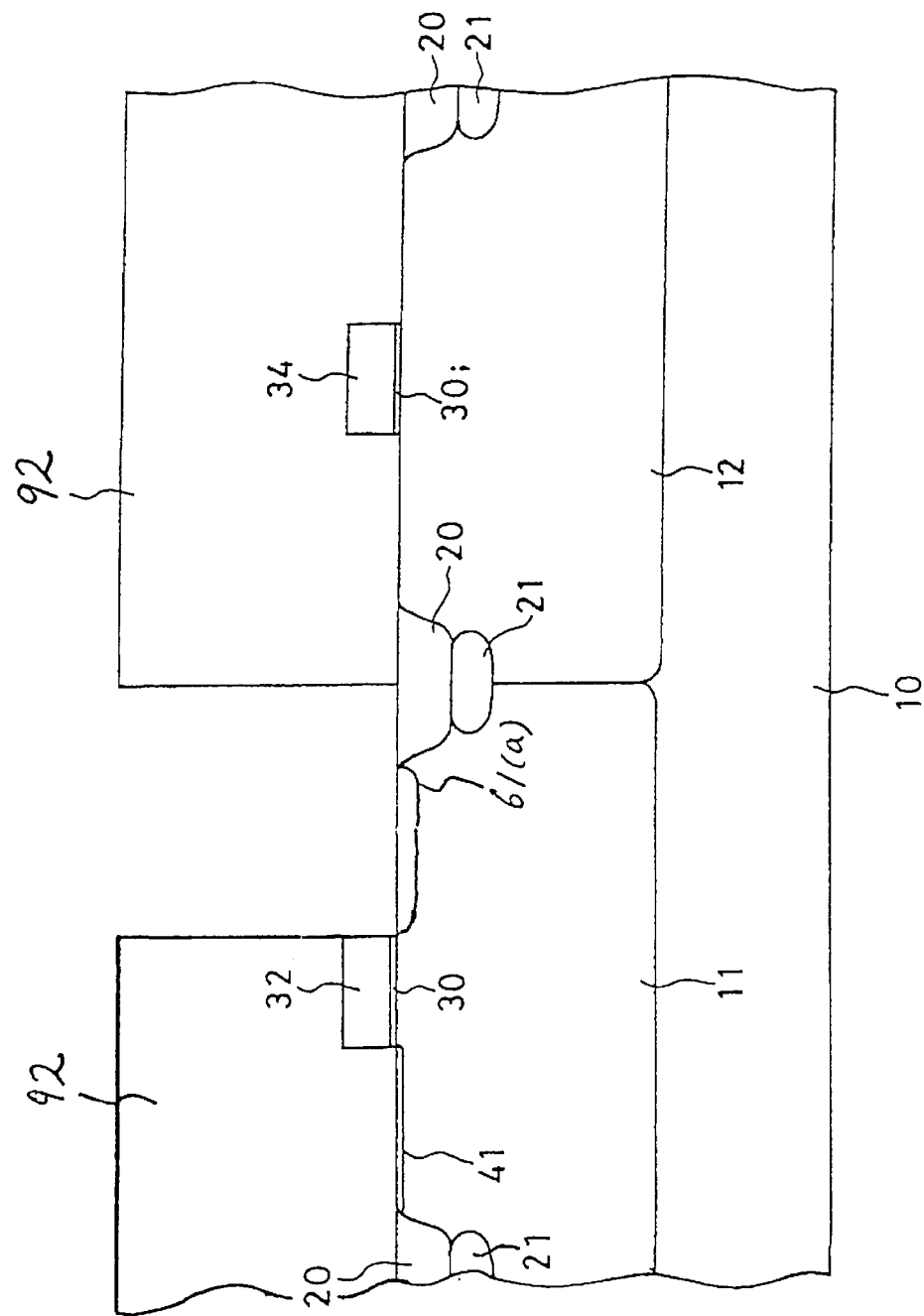

With reference to FIG. 4B, the used photo-resist film 91 is removed. Another photo-resist film 91' is entirely formed except over a source region of the n-channel MOS field effect transistor so that an n-type impurity such as phosphorus or arsenic is also selectively ion-implanted at an ion-implantation energy of 20–60 keV and a dose of 1E15–5E15 $cm^{-2}$ into the p-well region 11 by use of the n+-type polysilicon film 32 and the field oxide films 20 as masks whereby an n+-type source region 61(a) is formed in the p-well region 11.

Figure 4C:
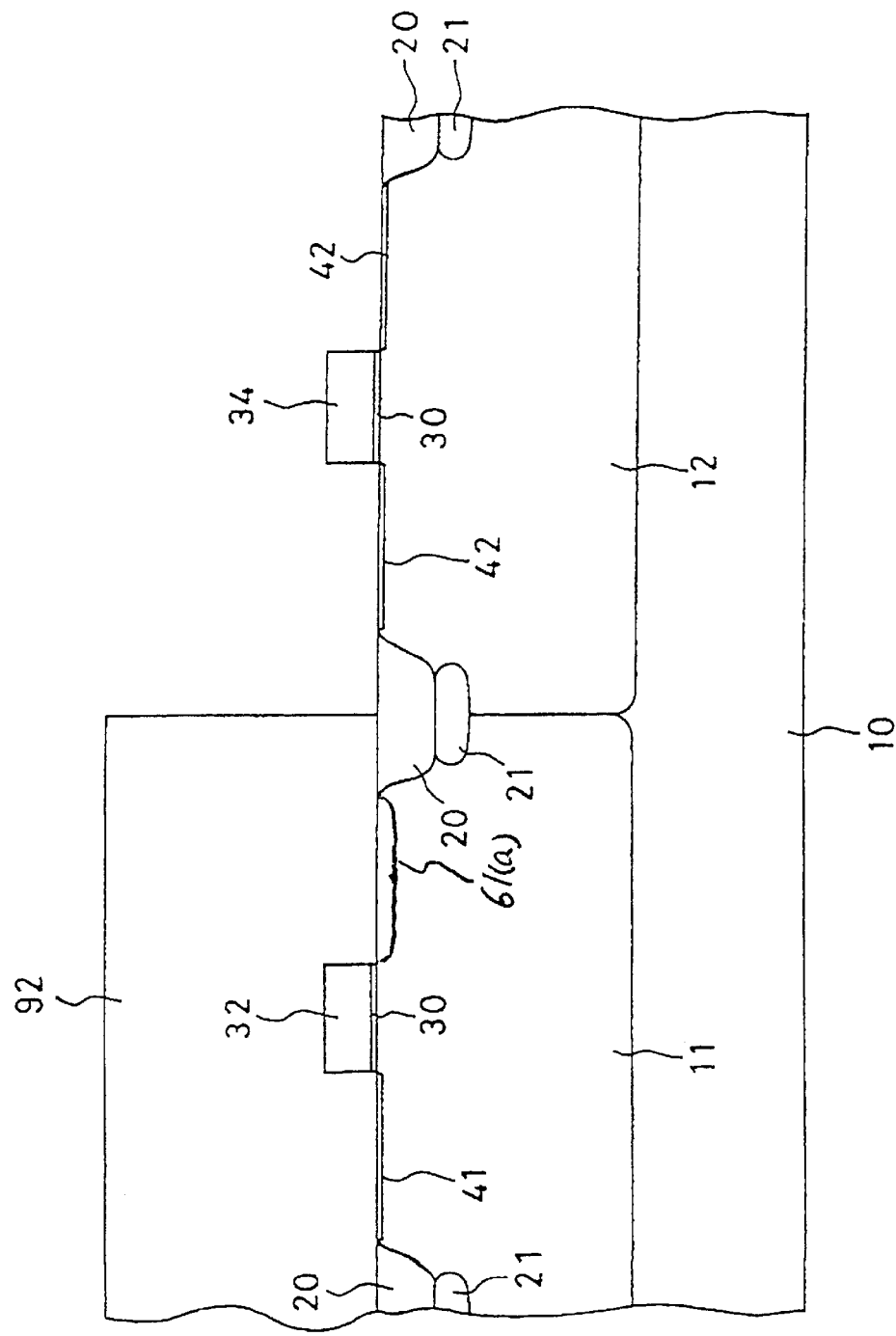

With reference to FIG. 4C, the used photo-resist film 91' is removed. Still another photo-resist film 92 is selectively formed over the p-well region 11 so that a p-type impurity such as boron or boron fluoride is also selectively ion-implanted at an ion-implantation energy of 15–50 keV and a dose of 1E12–3E13 cm$^{-2}$ into the n-well region 12 by use of the p+-type polysilicon film 34 and the field oxide films 20 as masks whereby lightly doped drain p--type diffusion layers 42 are formed in the n-well region 12. Concurrently, another ion-implantation of phosphorus may optionally be carried out into the n-well region under the lightly doped drain p--type diffusion layers 42 thereby forming p-type punch through stoppers not illustrated in the n-well region 12 and under the lightly doped drain p--type diffusion layers 42.

Figure 4D:
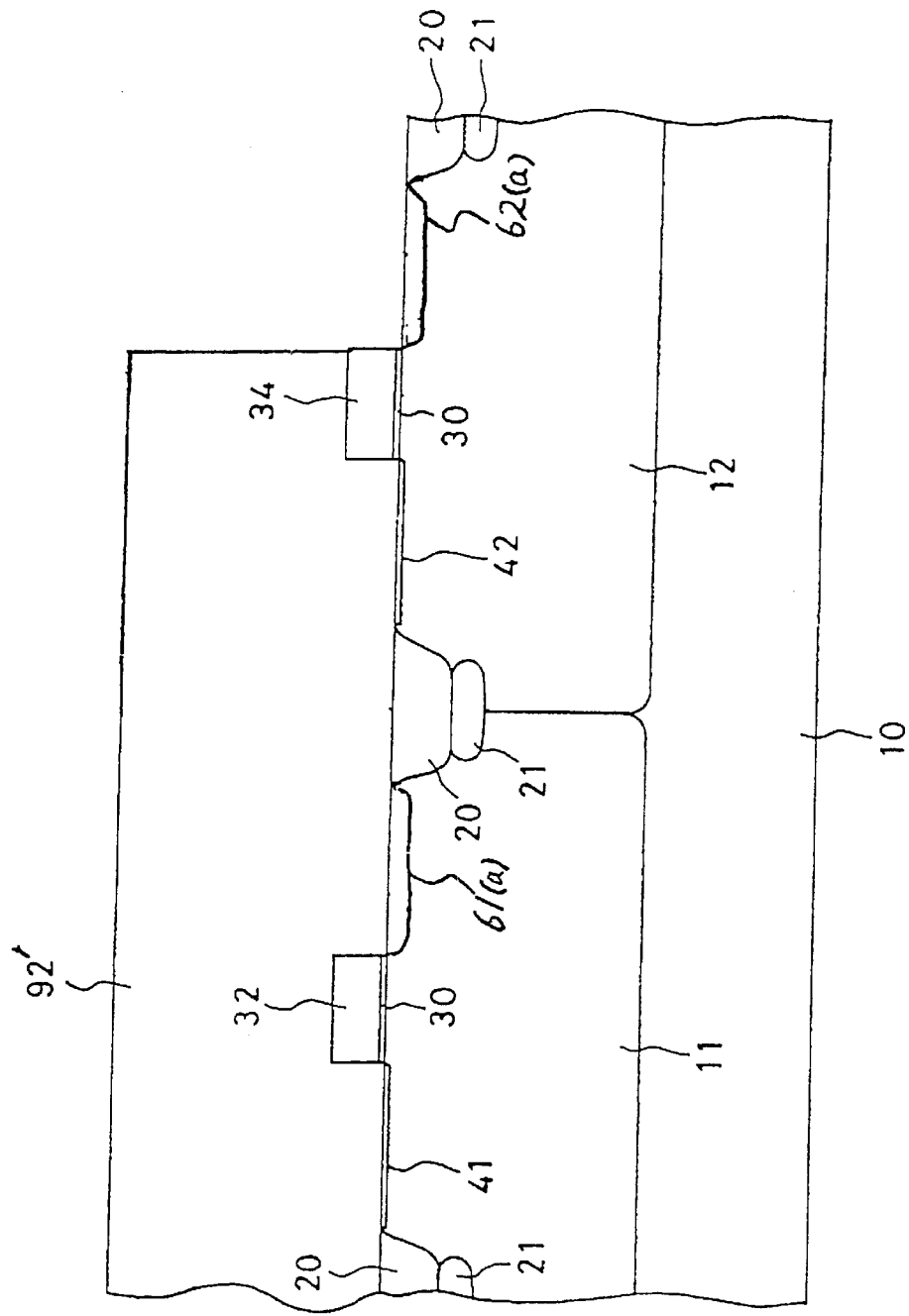

With reference to FIG. 4D, the used photo-resist film 92 is removed. Yet another photo-resist film 92' is entirely formed except over a source region of the p-channel MOS field effect transistor in the n-well region 12 so that a p-type impurity such as boron or boron fluoride is also selectively ion-implanted at an ion-implantation energy of 20–50 keV and a dose of 1E15–5E15 cm$^{-2}$ into the n-well region 12 by use of the p+-type polysilicon film 34 and the field oxide films 20 as masks whereby a p+-type source region 62(a) is formed in the n-well region 12.

Figure 4E:
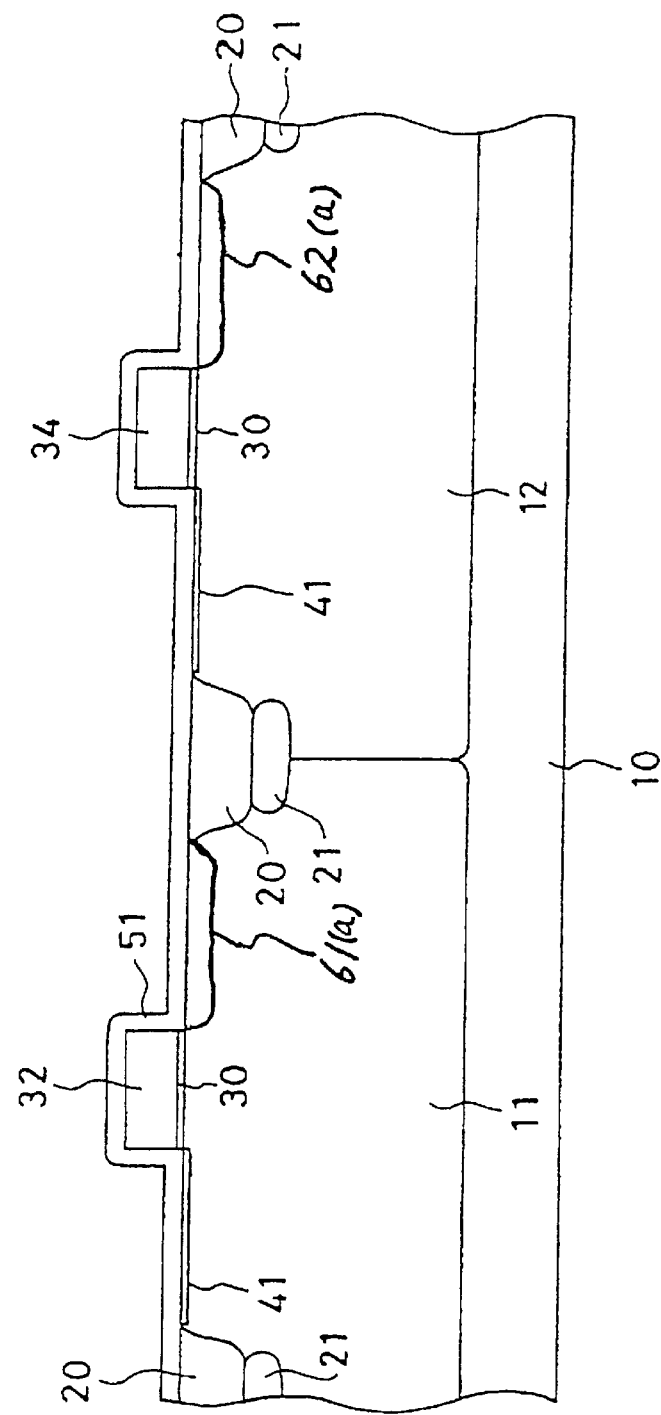

With reference to FIG. 4E, a hot temperature oxide film 51 which possesses a good step coverage is entirely formed which extends over the n+-type polysilicon film 32, the p+-type polysilicon film 34, the lightly doped drain n--type diffusion layers 41, and the lightly doped drain p--type diffusion layers 42 as well as the field oxide films 20 by a high temperature chemical vapor deposition method. The hot temperature oxide film 51 has a thickness of 30–100 nanometers.

Figure 4F:
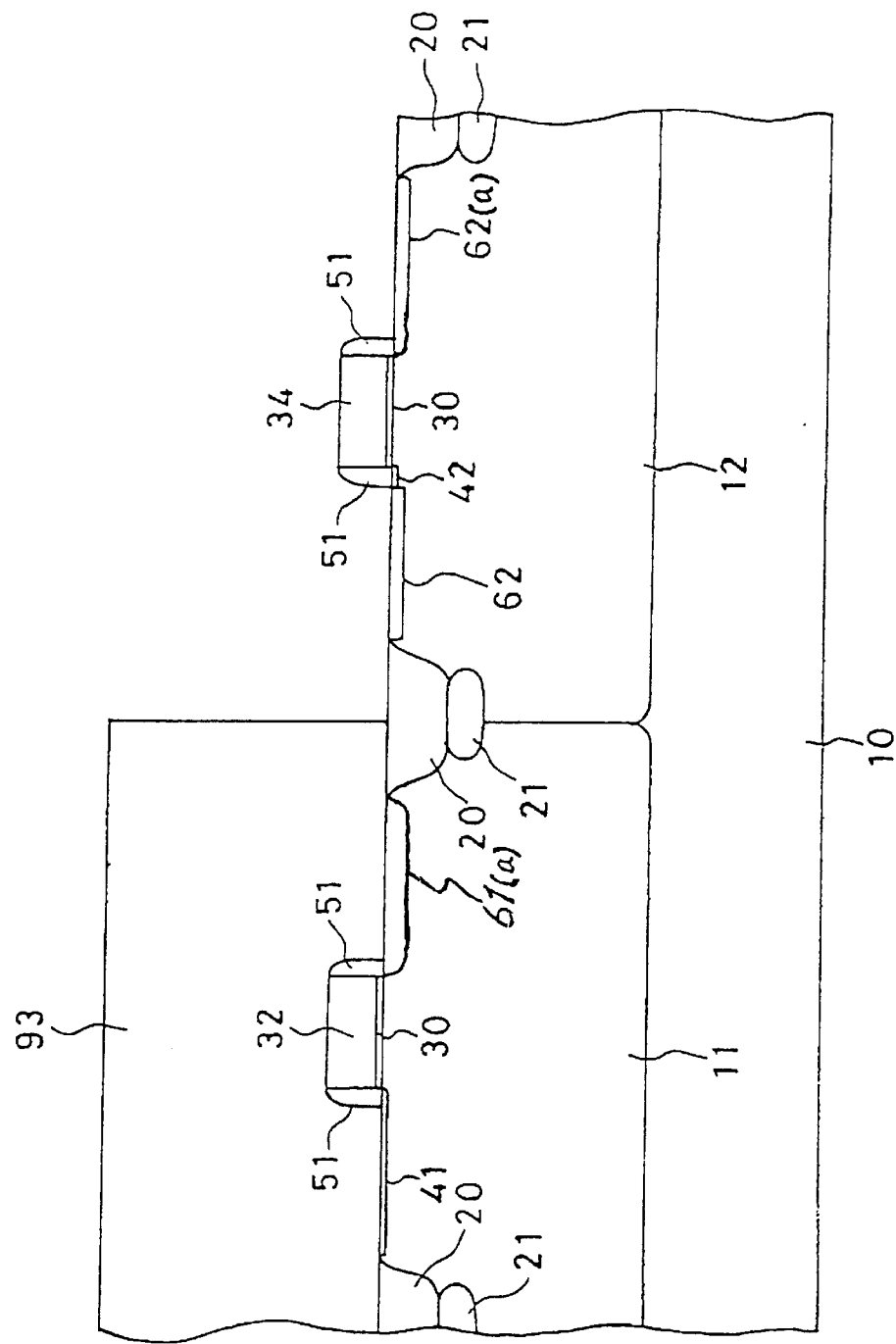

With reference to FIG. 4F, the hot temperature oxide film 51 is then subjected to an etch back to selectively form first side wall oxide films 51 on opposite side walls of each of the n+-type polysilicon film 32 and the p+-type polysilicon film 34. A photo-resist film 93 is selectively formed over the p-well region 11 so that a p-type impurity such as boron or boron fluoride is selectively ion-implanted at an ion-implantation energy of 20–50 keV and a dose of 1E15–5E15 cm$^{-2}$ into the n-well region 12 by use of the field oxide films 20, the p+-type polysilicon film 34 and the first side wall oxide films 51 as masks to selectively form source/drain p+-type diffusion layers 62 in the n-well region 12.

Figure 4G:
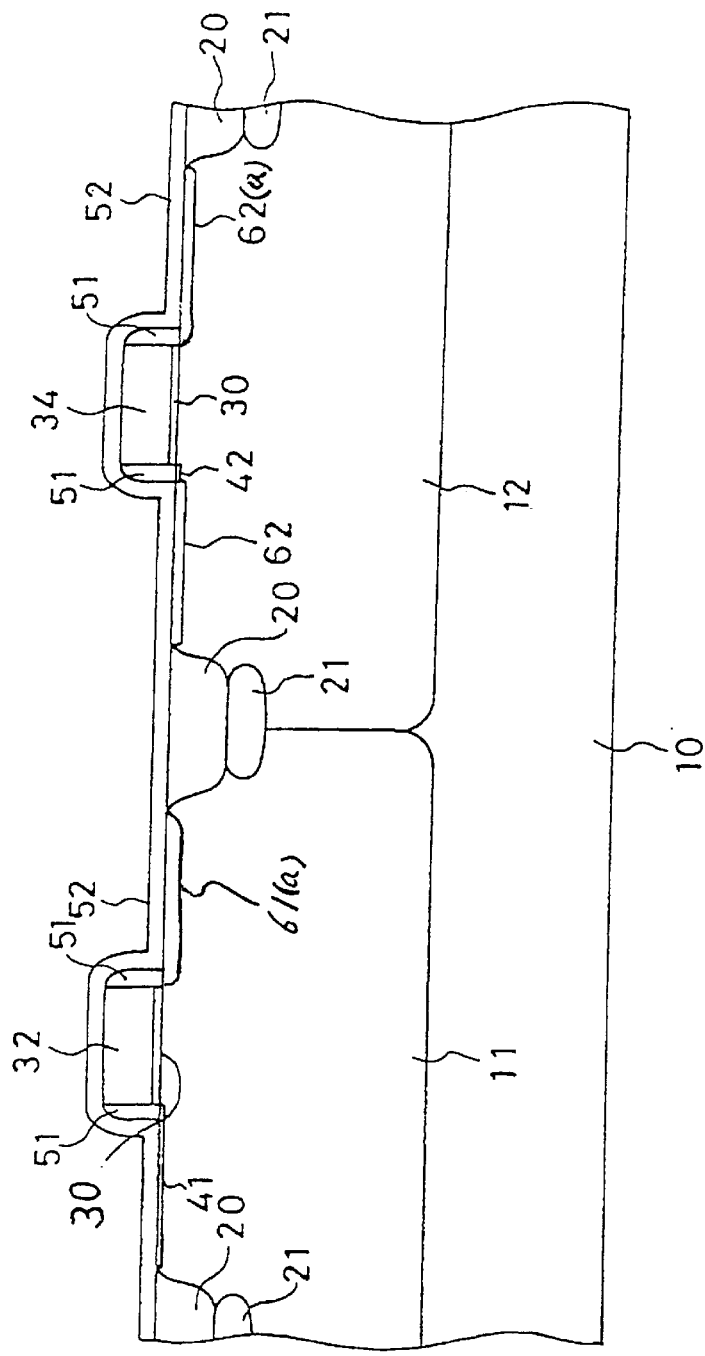

With reference to FIG. 4G, the used photo-resist film 93 is removed. A second hot temperature oxide film 52 which possesses a good step coverage is entirely formed which extends over the n+-type polysilicon film 32, the p+-type polysilicon film 34, the first side wall oxide films 51, the lightly doped drain n--type diffusion layer 41, the p+-type source region 61(a), the source/drain p+-type diffusion layers 62 as well as the field oxide films 20 by a high temperature chemical vapor deposition method. The second hot temperature oxide film 51 has a thickness of 30–100 nanometers.

Figure 4H:
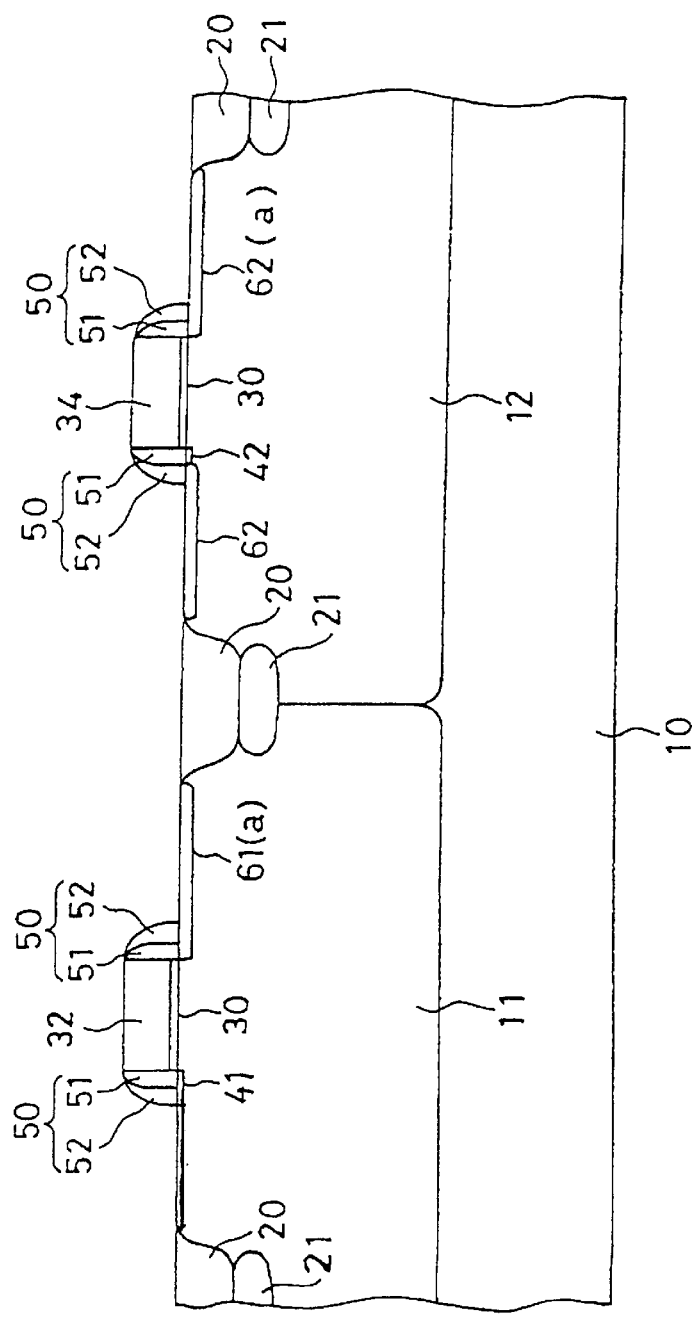

With reference to FIG. 4H, the second hot temperature oxide film 52 is then subjected to an etch back to selectively form second side wall oxide films 52 on the side wall oxide films 51 of each of the n+-type polysilicon film 32 and the p+-type polysilicon film 34 whereby side walls are formed on opposite side walls of each of the n+-type polysilicon film 32 and the p+-type polysilicon film 34, wherein the side walls 50 comprise laminations of the first and second side wall oxide films 51 and 52.

Figure 4I:
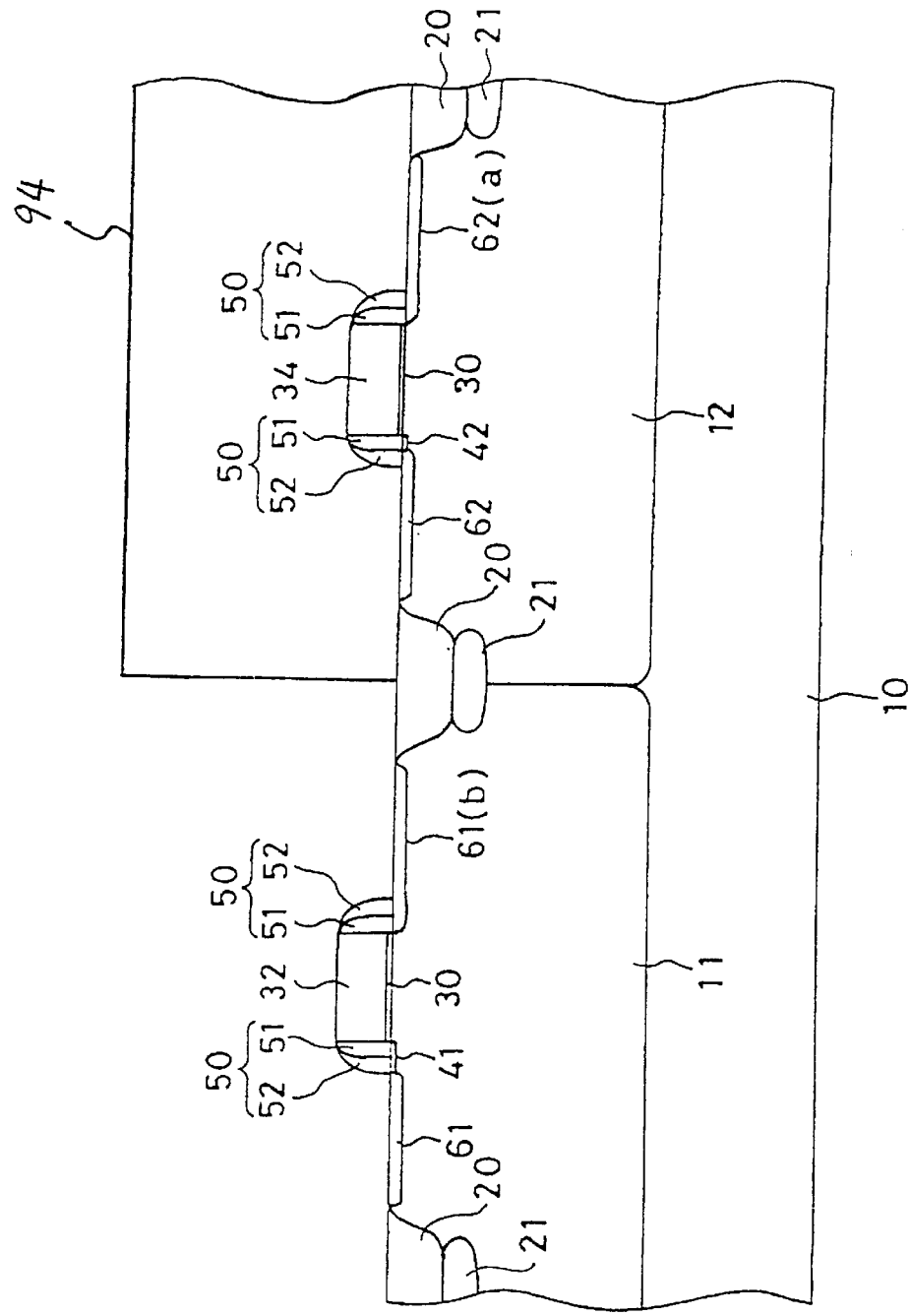

With reference to FIG. 4I, a photo-resist film 94 is selectively formed over the n-well region 12 so that an n-type impurity such as phosphorus or arsenic is selectively ion-implanted at an ion-implantation energy of 20–60 keV and a dose of 1E15–5E15 cm$^{-2}$ into the p-well region 11 by use of the field oxide films 20, the n+-type polysilicon film 32 and the side walls 50 as masks to selectively form source/drain n+-type diffusion layers 61 in the p-well region 11.

Figure 4J:
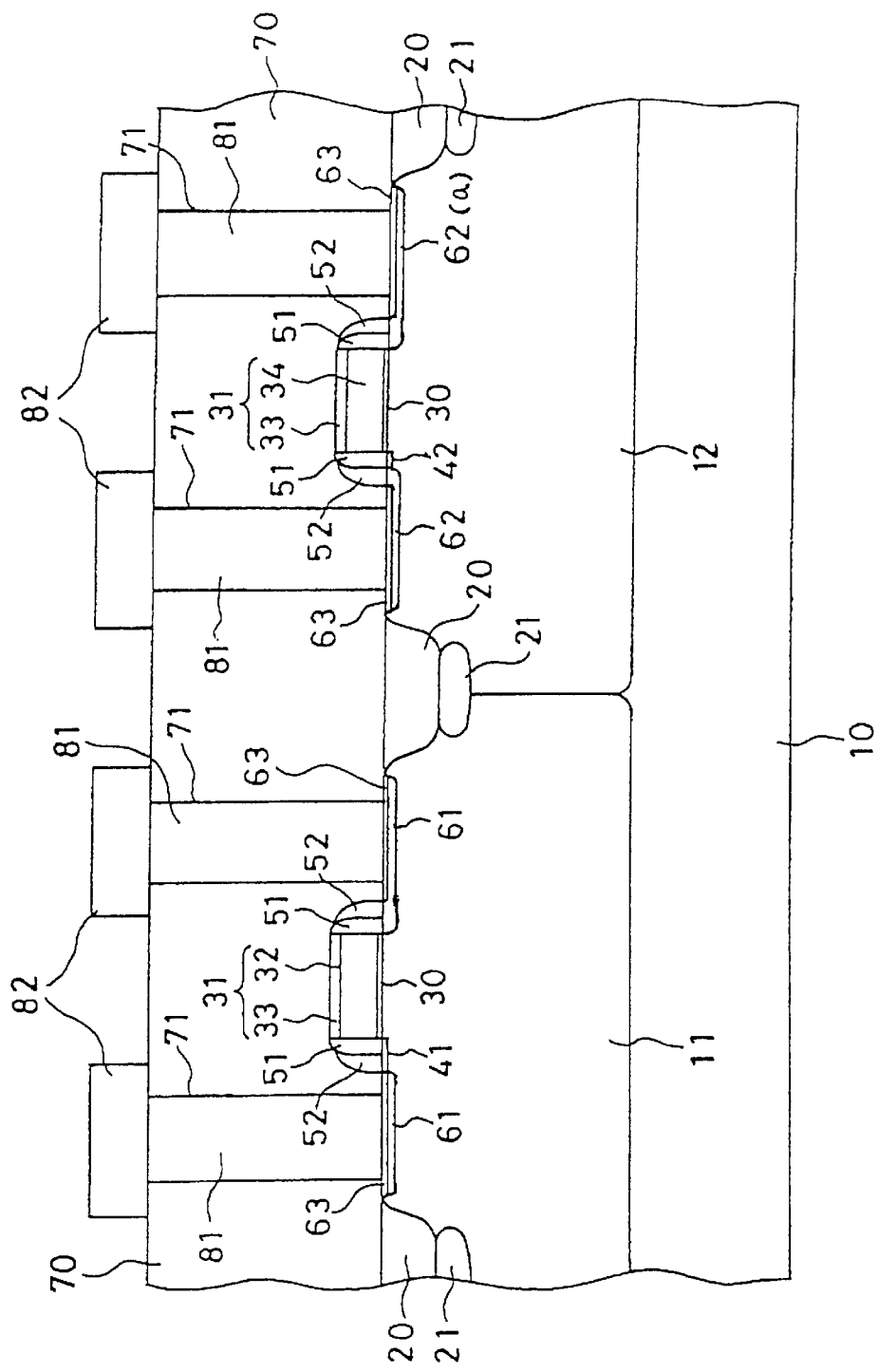

With reference to FIG. 4J, a refractory metal layer such as a titanium layer having a thickness of about 20–100 nanometers is entirely deposited by a sputtering method over the n+-type polysilicon film 32 and the p+-type polysilicon film 34, the side walls 50, the source/drain n+-type diffusion layers 61 and 61(a) and the source/drain p+-type diffusion layers 62 and 62(a) as well as the field oxide films 20. Subsequently, a heat treatment is carried out to cause a silicidation reaction of silicon with refractory metal such as titanium so that refractory metal silicide layers 33 are formed in the upper regions of the n+-type polysilicon film 32 and the p+-type polysilicon film 34 as well as other refractory metal silicide layers 63 are formed in the upper regions of the source/drain n+-type diffusion layers 61 and 61(a) and also in the upper regions of the source/drain p+-type diffusion layers 62 and 62(a). As a result, gate electrodes 31 are formed over the p-well region 11 and the n-well region 12 wherein the gate electrode 31 over the p-well region 11 comprises the n+-type polysilicon film 32 and the refractory metal silicide layer 33 whilst the gate electrode 31 over the n-well region 12 comprises the p+-type polysilicon film 34 and the refractory metal silicide layer 33. The unreacted refractory metal layer is removed. An inter-layer insulator 70 is entirely formed which covers the gate electrodes 31, the side walls 50, and the refractory metal silicide layers 63 over the source/drain n+-type and p+-type diffusion layers 61 and 62 as well as the field oxide films 20. The inter-layer insulator 70 may comprise laminations of a tetra-ethylorthosilicate film and a borophosphosiliciate glass film. The inter-layer insulator 70 has a thickness of about 800–1500 nanometers. Subsequently, a high temperature and short time lamp anneal is carried out at a temperature of 800–1100° C. for 10–60 seconds to activate the impurities without, however, causing the diffusion of the impurities so that lightly doped drain diffusion layers and the source/drain layers, both of which are shallow.

Contact holes 71 are selectively formed in the inter-layer insulator 70 so that the contact holes 71 are positioned over the refractory metal suicide layers 63 over the source/drain n+-type and p+-type diffusion layers 61, 61(a), 62 and 62(a). As a result, parts of the refractory metal silicide layers 63 over the source/drain n+-type and p+-type diffusion layers 61, 61(a), 62 and 62(a) are shown through the contact holes 71. Refractory metal contact plug layers 81 such as tungsten contact plug layers are selectively formed within the contact holes 71 so that the refractory metal contact plug layers 81 are made into contact with the refractory metal suicide layers 63 over the source/drain n+-type and p+-type diffusion layers 61 and 62. An interconnection layer 82 is entirely formed over the inter-layer insulator 70 and over the refractory metal contact plug layers 81. The interconnection layer 82 comprises an aluminum film or a film of aluminum and copper alloy. The interconnection layer 82 has a thickness of 300–800 nanometers. As a result, the CMOS device is completed.

As well illustrated in FIG. 4G, the lightly doped diffusion layer 42 shortened in length is formed adjacent to the source region 62(a) of the p-channel MOS field effect transistor. Further, no lightly doped diffusion layer is formed adjacent to the source region of the n-channel MOS field effect transistor. The hot carrier is caused at the lightly doped diffusion region adjacent to the drain region of each of the p-channel and n-channel MOS field effect transistors but no hot carrier is caused at the lightly doped diffusion region adjacent to the source region. For this reason, in order to suppress the hot carrier generation, it is required to provide a lightly doped diffusion region with a sufficiently long length adjacent to the drain diffusion region but not required to provide such the lightly doped diffusion region adjacent to the source region. No provision of such lightly doped diffusion region adjacent to the source region or shortening the length of the lightly doped diffusion region adjacent to the source region results in reduction in parasitic capacitance of the source region whereby the driving ability of the MOS field effect transistor is further improved.

In this embodiment, the source and drain diffusion regions are formed in the different steps. This means that it is possible to form the source and drain regions having different impurity concentrations from each other. If no lightly doped diffusion region is formed adjacent to the source region, then the source region is positioned adjacent to the channel region of the transistor, for which reason it is required to relax the field concentration at the boundary of between the channel region and the source region. For relaxation of the field concentration at the boundary of between the channel region and the source region, it is required to drop the impurity concentration of the source region. The relaxation of the field concentration at the boundary of between the channel region and the source region may suppress the short channel effect. On the other hand, the drain region may have a sufficiently high impurity concentration for reduction in parasitic capacitance because a sufficiently large lightly doped diffusion region for relaxation of the field concentration is formed adjacent to the drain region.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device having at least a p-channel MOS field effect transistor and at least an n-channel MOS field effect transistor, both of which are integrated on a single semiconductor substrate, said p-channel MOS field effect transistor having at least a first p-type lightly doped diffusion region adjacent to a p-type drain diffusion region and said n-channel MOS field effect transistor having at least a first n-type lightly doped diffusion region adjacent to an n-type drain diffusion region, wherein said first p-type lightly doped diffusion region of said p-channel MOS field effect transistor is shorter in a direction parallel to a channel length direction than a first n-type lightly doped diffusion region of said n-channel MOS field effect transistor, and wherein said p-channel and n-channel MOS field effect transistors are free of any lightly doped diffusion regions adjacent to source regions so that said source regions are adjacent to channel regions, and wherein said source regions have lower impurity concentrations than that of said drain regions.

2. The semiconductor device as claimed in claim 1, wherein a plurality of said p-channel MOS field effect transistors and a plurality of said n-channel MOS field effect transistors are integrated on said single semiconductor substrate, and wherein at least one of said first p-type lightly doped diffusion region of said p-channel MOS field effect transistors is shorter than every one of said first n-type lightly doped diffusion region of said n-channel MOS field effect transistors.

3. The semiconductor device as claimed in claim 2, wherein any one of said first p-type lightly doped diffusion region of said p-channel MOS field effect transistors is shorter than every one of said first n-type lightly doped diffusion region of said n-channel MOS field effect transistors.

4. The semiconductor device as claimed in claim 1, wherein said semiconductor device has an internal circuit region and an input/output circuit region, and wherein a plurality of said p-channel MOS field effect transistors and a plurality of said n-channel MOS field effect transistors are integrated in said internal circuit region, and any one of said first p-type lightly doped diffusion region of said p-channel MOS field effect transistors is shorter than every one of said first n-type lightly doped diffusion region of said n-channel MOS field effect transistors.

5. The semiconductor device as claimed in claim 1, wherein said semiconductor device has an internal circuit region and an input/output circuit region, and wherein a plurality of said p-channel MOS field effect transistors and a plurality of said n-channel MOS field effect transistors are integrated in said input/output circuit region, and any one of said first p-type lightly doped diffusion region of said p-channel MOS field effect transistors is shorter than every one of said first n-type lightly doped diffusion region of said n-channel MOS field effect transistors.

6. The semiconductor device as claimed in claim 1, wherein said p-channel and n-channel MOS field effect transistors make a pair in the form of a CMOS circuit in said single semiconductor substrate.

7. The semiconductor device as claimed in claim 1, wherein said first p-type lightly doped diffusion region has the same length as a thickness of a first side wall oxide film on a side of a gate electrode whilst said first n-type lightly doped diffusion region has the same length as a total thickness of said first side wall oxide film and a second side wall oxide film on a side of said first side wall oxide film.

8. The semiconductor device as claimed in claim 1, further comprising a punch through stopper formed beneath said first p-type lightly doped diffusion region.

9. The semiconductor device as claimed in claim 1, further comprising a punch through stopper formed beneath said first n-type lightly doped diffusion region.

10. A CMOS device comprising a p-channel MOS field effect transistor and an n-channel MOS field effect transistor, both of which are integrated on a single semiconductor substrate, said p-channel MOS field effect transistor having a first p-type lightly doped diffusion region adjacent to a p-type drain diffusion region and said n-channel MOS field effect transistor having a first n-type lightly doped diffusion region adjacent to an n-type drain diffusion region, wherein said first p-type lightly doped diffusion region of said p-channel MOS field effect transistor is shorter in a direction parallel to a channel length direction than a first n-type lightly doped diffusion region of said n-channel MOS field effect transistor, and wherein said p-channel and n-channel MOS field effect transistors are free of any lightly doped diffusion regions adjacent to source regions so that said source regions are adjacent to channel regions, and wherein said source regions have lower impurity concentrations than that of said drain regions.

11. The CMOS device as claimed in claim 10, wherein said first p-type lightly doped diffusion region has the same length as a thickness of a first side wall oxide film on a side of a gate electrode whilst said first n-type lightly doped diffusion region has the same length as a total thickness of said first side wall oxide film and a second side wall oxide film on a side of said first side wall oxide film.

12. The CMOS device as claimed in claim 10, further comprising a punch through stopper formed beneath said first p-type lightly doped diffusion region.

13. The CMOS device as claimed in claim 10, further comprising a punch through stopper formed beneath said first n-type lightly doped diffusion region.

14. A semiconductor device having at least a p-channel field effect transistor and at least an n-channel field effect transistor, both of which are integrated on a single semiconductor substrate, said p-channel field effect transistor having at least a first p-type lightly doped diffusion region adjacent to a p-type drain diffusion region and said n-channel field effect transistor having at least a first n-type lightly doped diffusion region adjacent to an n-type drain diffusion region, wherein said first p-type lightly doped diffusion region of said p-channel field effect transistor is shorter in a direction parallel to a channel length direction than a first n-type lightly doped diffusion region of said n-channel field, effect transistor wherein said p-channel and n-channel MOS field effect transistors are free of any lightly doped diffusion regions adjacent to source regions so that said source regions are adjacent to channel regions, and wherein said source regions have lower impurity concentrations than that of said drain regions.

15. The semiconductor device as claimed in claim 14, wherein a plurality of said p-channel field effect transistors and a plurality of said n-channel field effect transistors are integrated on said single semiconductor substrate, and wherein at least one of said first p-type lightly doped diffusion region of said p-channel field effect transistors is shorter than every one of said first n-type lightly doped diffusion region of said n-channel field effect transistors.

16. The semiconductor device as claimed in claim 15, wherein any one of said first p-type lightly doped diffusion region of said p-channel field effect transistors is shorter than every one of said first n-type lightly doped diffusion region of said n-channel field effect transistors.

17. The semiconductor device as claimed in claim 14, wherein said semiconductor device has an internal circuit region and an input/output circuit region, and wherein a plurality of said p-channel field effect transistors and a plurality of said n-channel field effect transistors are integrated in said internal circuit region, and any one of said first p-type lightly doped diffusion region of said p-channel field effect transistors is shorter than every one of said first n-type lightly doped diffusion region of said n-channel field effect transistors.

18. The semiconductor device as claimed in claim 14, wherein said semiconductor device has an internal circuit region and an input/output circuit region, and wherein a plurality of said p-channel field effect transistors and a plurality of said n-channel field effect transistors are integrated in said input/output circuit region, and any one of said first p-type lightly doped diffusion region of said p-channel field effect transistors is shorter than every one of said first n-type lightly doped diffusion region of said n-channel field effect transistors.

19. The semiconductor device as claimed in claim 14, wherein said first p-type lightly doped diffusion region has the same length as a thickness of a first side wall oxide film on a side of a gate electrode whilst said first n-type lightly doped diffusion region has the same length as a total thickness of said first side wall oxide film and a second side wall oxide film on a side of said first side wall oxide film.

20. The semiconductor device as claimed in claim 14, further comprising a punch through stopper formed beneath said first p-type lightly doped diffusion region.

21. The semiconductor device as claimed in claim 14, further comprising a punch through stopper formed beneath said first n-type lightly doped diffusion region.

* * * * *